(12) United States Patent
Moon et al.

(10) Patent No.: US 11,910,516 B2
(45) Date of Patent: Feb. 20, 2024

(54) ELECTRONIC DEVICE INCLUDING HEAT DISSIPATION STRUCTURE

(71) Applicant: SAMSUNG ELECTRONICS CO., LTD., Gyeonggi-do (KR)

(72) Inventors: Hongki Moon, Gyeonggi-do (KR); Yoonsun Park, Gyeonggi-do (KR); Seunghoon Kang, Gyeonggi-do (KR); Kyungha Koo, Gyeonggi-do (KR); Seyoung Jang, Gyeonggi-do (KR); Woojune Jung, Gyeonggi-do (KR)

(73) Assignee: Samsung Electronics Co., Ltd (KR)

( * ) Notice: Subject to any disclaimer, the term of this patent is extended or adjusted under 35 U.S.C. 154(b) by 241 days.

(21) Appl. No.: 17/293,280

(22) PCT Filed: Nov. 8, 2019

(86) PCT No.: PCT/KR2019/015133
§ 371 (c)(1),
(2) Date: May 12, 2021

(87) PCT Pub. No.: WO2020/101274
PCT Pub. Date: May 22, 2020

(65) Prior Publication Data
US 2021/0410268 A1     Dec. 30, 2021

(30) Foreign Application Priority Data
Nov. 12, 2018    (KR) ......... 10-2018-0138566

(51) Int. Cl.
*H05K 1/02* (2006.01)
*H05K 1/14* (2006.01)
*H05K 7/20* (2006.01)

(52) U.S. Cl.
CPC ......... *H05K 1/0203* (2013.01); *H05K 1/14* (2013.01); *H05K 7/20336* (2013.01); *H05K 2201/064* (2013.01); *H05K 2201/10098* (2013.01)

(58) Field of Classification Search
CPC ........ H05K 1/0203; H05K 1/144; H05K 1/14; H05K 7/20336; H05K 2201/064;
(Continued)

(56) References Cited

U.S. PATENT DOCUMENTS 9,578,780 B1    2/2017  Shih et al.
2011/0188207 A1*  8/2011  Won .......... H04B 1/036
                                                  361/709
(Continued)

FOREIGN PATENT DOCUMENTS

CN    102045992    5/2011
CN    204651482    9/2015
(Continued)

OTHER PUBLICATIONS

PCT/ISA/210 Search Report issued on PCT/KR2019/015133, dated Feb. 17, 2020, pp. 5.
(Continued)

*Primary Examiner* — Adam B Dravininkas
(74) *Attorney, Agent, or Firm* — The Farrell Law Firm, P.C.

(57) ABSTRACT

Disclosed is an electronic device including a heat dissipation structure that includes a first printed circuit board; a thermal diffusion member arranged in parallel to the first printed circuit board; a second printed circuit board which is arranged to be separated from the first printed circuit board and which is electrically connected with the first printed circuit board; and a heat transfer member of which at least a partial area faces a heat dissipation member, and of which (Continued)

at least another partial area, formed to be bent, is arranged to face one surface of the second printed circuit, and additional other various embodiments are possible.

13 Claims, 12 Drawing Sheets

(58) Field of Classification Search
CPC ... H05K 2201/042; H05K 2201/10098; H05K 7/2039
See application file for complete search history.

(56) References Cited

U.S. PATENT DOCUMENTS

| | | | |
|---|---|---|---|
| 2012/0063094 | A1 | 3/2012 | Gaynes et al. |
| 2015/0017830 | A1* | 1/2015 | Yu ..................... H01R 12/7088 439/485 |
| 2015/0155614 | A1 | 6/2015 | Youn et al. |
| 2015/0241935 | A1* | 8/2015 | Jang ..................... G06F 1/1626 361/679.56 |
| 2015/0323262 | A1* | 11/2015 | Kim ..................... F28F 21/081 165/104.21 |
| 2016/0148902 | A1* | 5/2016 | Chen ..................... H01L 25/50 438/107 |
| 2016/0248893 | A1 | 8/2016 | Kim |
| 2018/0084680 | A1* | 3/2018 | Jarvis ..................... H05K 1/148 |
| 2018/0241430 | A1 | 8/2018 | Youn et al. |
| 2018/0284512 | A1* | 10/2018 | Lee ..................... G06F 1/1626 |
| 2018/0284856 | A1* | 10/2018 | Shah ..................... G06F 1/1616 |
| 2019/0364695 | A1 | 11/2019 | Lee et al. |
| 2020/0060043 | A1 | 2/2020 | Lee et al. |

FOREIGN PATENT DOCUMENTS

| | | |
|---|---|---|
| CN | 107006136 | 8/2017 |
| CN | 108664161 | 10/2018 |
| CN | 108776530 | 11/2018 |
| EP | 3 261 173 | 12/2017 |
| JP | 08-102512 | 4/1996 |
| JP | 2001-160608 | 6/2001 |
| JP | 2008-227362 | 9/2008 |
| JP | 2016-152254 | 8/2016 |
| KR | 10-2015-0127473 | 11/2015 |
| KR | 10-2017-0097541 | 8/2017 |
| KR | 10-2018-0024434 | 3/2018 |
| KR | 1020180110946 | 10/2018 |
| WO | WO 2018/092949 | 5/2018 |

OTHER PUBLICATIONS

PCT/ISA/237 Written Opinion issued on PCT/KR2019/015133, dated Feb. 17, 2020, pp. 4.
European Search Report dated Nov. 4, 2021 issued in counterpart application No. 19885596.7-1203, 9 pages.
Indian Examination Report dated Jan. 10, 2023 issued in counterpart application No. 202117025686, 6 pages.
Chinese Office Action dated Aug. 3, 2023 issued in counterpart application No. 201980074321.7, 18 pages.
Korean Office Action dated Aug. 17, 2023 issued in counterpart application No. 10-2018-0138566, 9 pages.
European Search Report dated Oct. 2, 2023 issued in counterpart application No. 19885596.7-1224, 7 pages.

* cited by examiner

ELECTRONIC DEVICE INCLUDING HEAT DISSIPATION STRUCTURE

CROSS-REFERENCE TO RELATED APPLICATION(S)

This application is a National Phase Entry of PCT International Application No. PCT/KR2019/015133, which was filed on Nov. 8, 2019 and claims priority to Korean Patent Application No. 10-2018-0138566, which was filed in the Korean Intellectual Property Office on Nov. 12, 2018, the contents of each of which are incorporated herein by reference.

BACKGROUND

1. Field

Various embodiments of the disclosure relate to an electronic device including a heat dissipation structure.

2. Description of the Related Art

Recently, electronic devices such as portable terminals having novel functions have been developed at a rapid pace, and as the distribution of the portable terminals has been expanded, the proportion of electronic devices in people's lives is gradually increasing.

With respect to portable terminals such as smartphones, which have become popularized due to the development of mobile communication technology, demand for miniaturization and weight reduction is increasing in order to maximize the portability and convenience of users, and integrated electrical elements are being mounted in smaller spaces in order to achieve high performance.

SUMMARY

As the degree of integration of electronic devices increases, integrated electrical elements may be separately mounted on printed circuit boards embedded in the electronic devices in a modular form. These modular electrical elements (e.g., an antenna module, a communication module, a processor, etc.) degrade the performance of electronic devices due to heat generated therefrom in the operation of signal processing or the like. Accordingly, the modular electric elements may require an environment capable of dissipating heat generated during operation.

The disclosure provides an electronic device including a heat dissipation structure capable of dissipating heat of a modular electric element mounted in the electronic device through transfer, diffusion, dispersion, or external emission.

However, the technical problems to be solved by various embodiments of the disclosure are not limited to the technical problems described above, and other technical problems may exist.

According to various embodiments of the disclosure, an electronic device may include a first printed circuit board; a thermal diffusion member (thermal spreader) arranged in parallel with the first printed circuit board; a second printed circuit board arranged to be separated from the first printed circuit board and electrically connected to the first printed circuit board; and a heat transfer member having at least one partial area arranged to face the thermal diffusion member (thermal spreader) and at least one other partial area formed through bending arranged to face one surface of the second printed circuit board.

According to various embodiments of the disclosure, an electronic device may include: a printed circuit board on which a communication circuit is arranged; a thermal diffusion member (thermal spreader) arranged in parallel to the printed circuit board; an antenna module arranged to be separated from the printed circuit board, and electrically connected to the printed circuit board so as to be functionally connected to the communication module; and a heat transfer member including at least one partial area arranged to face the thermal diffusion member and at least one other partial area bent and arranged to face one surface of the antenna module.

According to various embodiments of the disclosure, an electronic device may include: a first printed circuit board on which a first communication circuit is arranged; a second printed circuit board including a first surface, on which a second communication circuit is arranged, and a second surface; at least one antenna pattern arranged to face the second surface and electrically connected to the first printed circuit board; a thermal diffusion member (thermal spreader) arranged in parallel to the first printed circuit board; and a heat transfer member including an area, at least a portion of which is bent and which is arranged to face the first surface of the second printed circuit board, and another area, at least a portion of which is arranged to face the thermal diffusion member so as to form a heat transfer path that transfers heat generated from the first surface to the thermal diffusion member.

According to various embodiments of the disclosure, an electronic device having a heat dissipation structure may include: first and second printed circuit boards on each of which at least one electric element is mounted; first and second thermal diffusion members; and a heat transfer member, wherein the heat transfer member may include: a first heat transfer area arranged in a first direction (X axis or Y axis) to correspond to one surface of the at least one electric element arranged on the second printed circuit board; a second heat transfer area arranged in the first direction (X axis or Y axis) to be stepped from the first heat transfer member; and a third heat transfer area arranged between the first and second heat transfer areas and bent from the first heat transfer area to a second direction (Z axis) perpendicular to the first direction (X axis or Y axis), wherein a first surface of the first heat transfer area may be arranged to correspond to one surface of the first printed circuit board, and a second surface of the first heat transfer area opposite to the first surface of the first heat transfer area may be arranged to correspond to one surface of the second printed circuit board, wherein first surface of the second heat transfer area may be arranged to correspond to one surface of the first thermal diffusion member and a second surface of the second heat transfer area opposite to the first surface of the second heat transfer area may be arranged to correspond to one surface of the second thermal diffusion member, and wherein the third heat transfer area may interconnect the first and second heat transfer areas, which are arranged to be stepped.

According to various embodiments of the disclosure, an electronic device having a heat dissipation structure may include: a first printed circuit board arranged in a first direction (X axis or Y axis) in the electronic device; a second printed circuit board including a plurality of electric elements arranged in a second direction (Z axis) perpendicular to the first direction (X axis or Y axis); a heat transfer member including first and second heat transfer areas arranged in the second direction (Z axis) to correspond to one surfaces of the plurality of electric elements, a third heat transfer area connected to the first heat transfer area and arranged in the first direction (X axis or Y axis), and a fourth heat transfer area interconnecting the second heat transfer area and the third heat transfer area; and a first thermal diffusion member connected to the third heat transfer area.

According to various embodiments of the disclosure, by transferring, diffusing, dispersing, or releasing heat generated from electric elements (e.g., an antenna module, a communication module, and a processor) arranged vertically, horizontally, or in a stepped form in an electronic device to a cooling structure or the like, the heat dissipation structure is capable of not only dissipating the heat generated from the electric elements, but also creating a stable operating environment for the electric elements.

DETAILED DESCRIPTION

Figure 1:
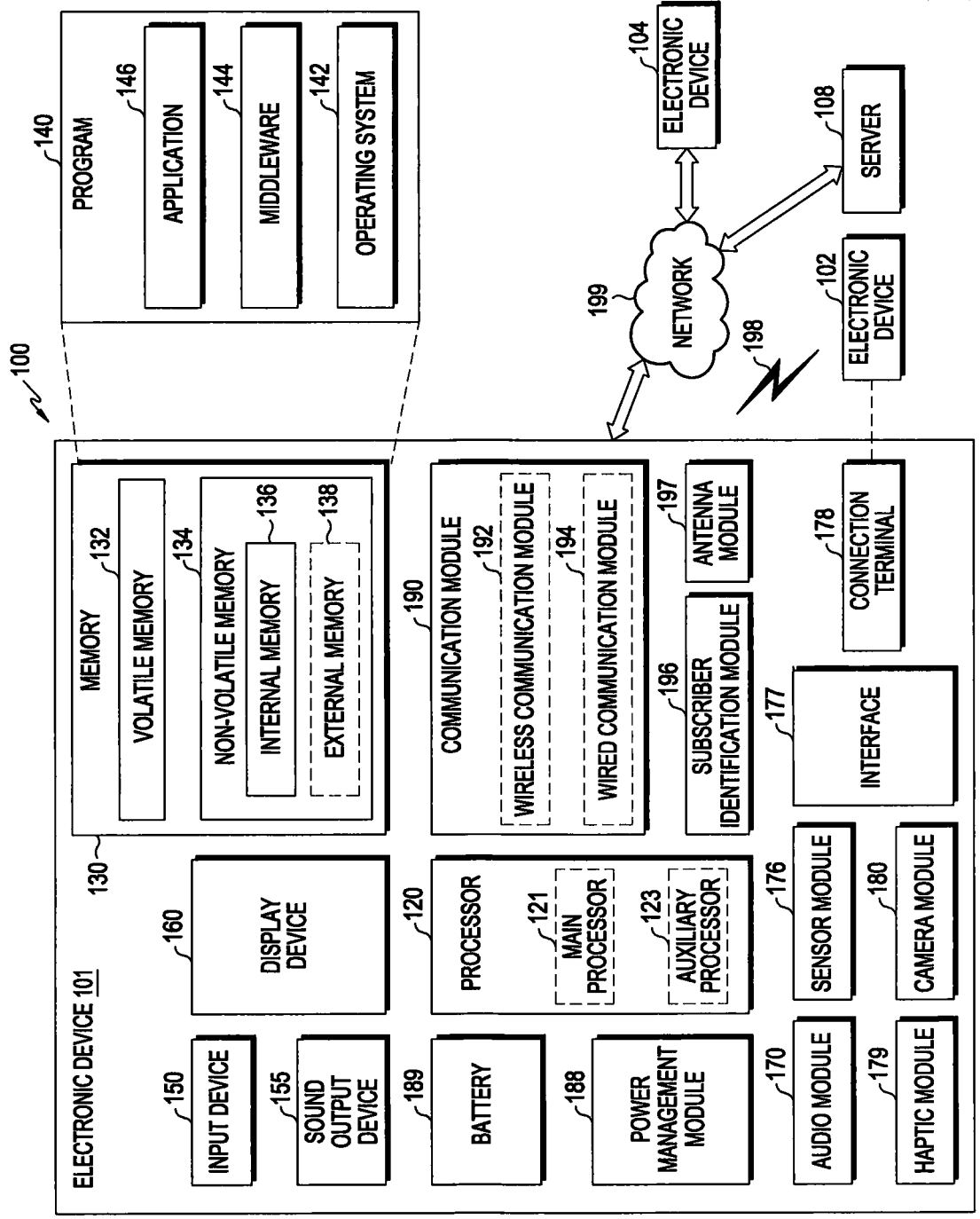
FIG. 1 is a block diagram of an electronic device according to various embodiments in a network environment.

FIG. 1 is a block diagram illustrating an electronic device 101 in a network environment 100 according to various embodiments.

Referring to FIG. 1, the electronic device 101 in the network environment 100 may communicate with an electronic device 102 via a first network 198 (e.g., a short-range wireless communication network), or an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input device 150, a sound output device 155, a display device 160, an audio module 170, a sensor module 176, an interface 177, a haptic module 179, a camera module 180, a power management module 188, a battery 189, a communication module 190, a subscriber identification module (SIM) 196, or an antenna module 197. In some embodiments, at least one (e.g., the display device 160 or the camera module 180) of the components may be omitted from the electronic device 101, or one or more other components may be added in the electronic device 101. In some embodiments, some of the components may be implemented as single integrated circuitry. For example, the sensor module 176 (e.g., a fingerprint sensor, an iris sensor, or an illuminance sensor) may be implemented as embedded in the display device 160 (e.g., a display).

The processor 120 may execute, for example, software (e.g., a program 140) to control at least one other component (e.g., a hardware or software component) of the electronic device 101 coupled with the processor 120, and may perform various data processing or computation. According to one embodiment, as at least part of the data processing or computation, the processor 120 may load a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), and an auxiliary processor 123 (e.g., a graphics processing unit (GPU), an image signal processor (ISP), a sensor hub processor, or a communication processor (CP)) that is operable independently from, or in conjunction with, the main processor 121. Additionally or alternatively, the auxiliary processor 123 may be adapted to consume less power than the main processor 121, or to be specific to a specified function. The auxiliary processor 123 may be implemented as separate from, or as part of the main processor 121.

The auxiliary processor 123 may control, for example, at least some of functions or states related to at least one component (e.g., the display device 160, the sensor module 176, or the communication module 190) among the components of the electronic device 101, instead of the main processor 121 while the main processor 121 is in an inactive (e.g., sleep) state, or together with the main processor 121 while the main processor 121 is in an active (e.g., executing an application) state. According to an embodiment, the auxiliary processor 123 (e.g., an image signal processor or a communication processor) may be implemented as part of another component (e.g., the camera module 180 or the communication module 190) functionally related to the auxiliary processor 123.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input device 150 may receive a command or data to be used by a component (e.g., the processor 120) of the electronic device 101, from the outside (e.g., a user) of the electronic device 101. The input device 150 may include, for example, a microphone, a mouse, or a keyboard.

The sound output device 155 may output sound signals to the outside of the electronic device 101. The sound output device 155 may include, for example, a speaker or a receiver. The speaker may be used for general purposes, such as playing multimedia or playing record, and the receiver may be used for incoming calls. According to an embodiment, the receiver may be implemented as separate from, or as part of the speaker.

The display device 160 may visually provide information to the outside (e.g., a user) of the electronic device 101. The display device 160 may include, for example, a display, a hologram device, or a projector and control circuitry to control a corresponding one of the display, hologram device, and projector. According to an embodiment, the display device 160 may include touch circuitry adapted to detect a touch, or sensor circuitry (e.g., a pressure sensor) adapted to measure the intensity of force incurred by the touch.

The audio module 170 may convert a sound into an electrical signal and vice versa. According to an embodiment, the audio module 170 may obtain the sound via the input device 150, or output the sound via the sound output device 155 or an external electronic device (e.g., an electronic device 102 (e.g., a speaker or a headphone)) directly or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image and moving images. According to an embodiment, the camera module 180 may include one or more lenses, image sensors, image signal processors, or flashes.

The power management module 188 may manage power supplied to the electronic device 101. According to one embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and support a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a cellular network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The antenna module 197 may transmit or receive a signal or power to or from the outside (e.g., the external electronic device) of the electronic device 101. According to an embodiment, the antenna module 197 may include one or more antennas, and at least one antenna appropriate for a communication scheme used in the communication network, such as the first network 198 or the second network 199, may be selected, for example, by the communication module 190 from the one or more antennas. The signal or the power may then be transmitted or received between the communication module 190 and the external electronic device via the selected at least one antenna.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 and 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, or client-server computing technology may be used, for example.

The electronic device according to various embodiments may be one of various types of electronic devices. The electronic devices may include, for example, a portable communication device (e.g., a smartphone), a computer device, a portable multimedia device, a portable medical device, a camera, a wearable device, or a home appliance. According to an embodiment of the disclosure, the electronic devices are not limited to those described above.

It should be appreciated that various embodiments of the disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used herein, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., a program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities. According to various embodiments, one or more of the above-described components or operations may be omitted, or one or more other components or operations may be added. Alternatively or additionally, a plurality of components (e.g., modules or programs) may be integrated into a single component. In such a case, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

Figure 2:
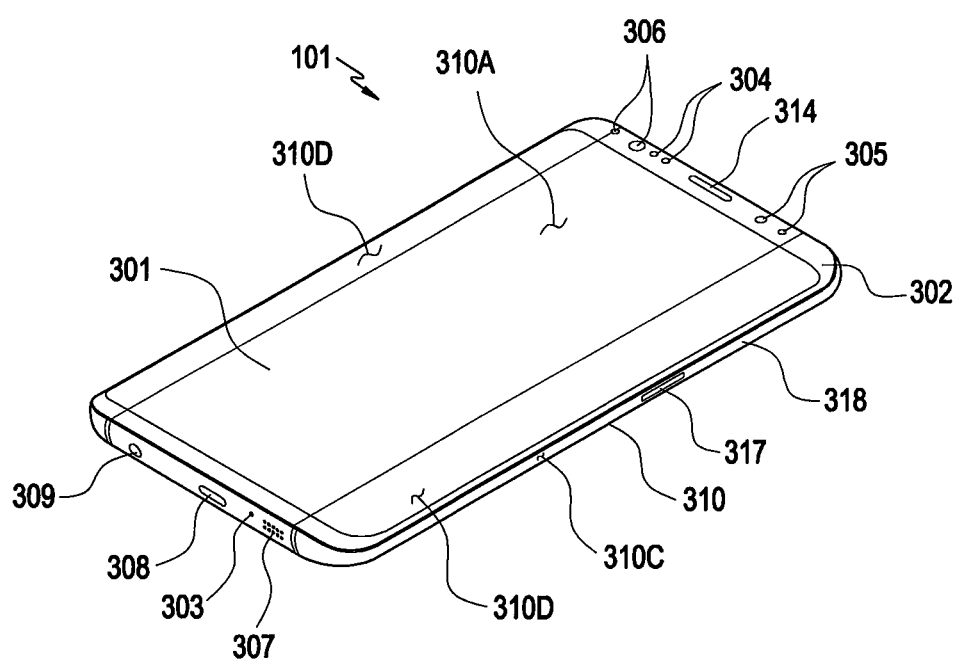
FIG. 2 is a front side perspective view illustrating an electronic device according to various embodiments of the disclosure.
Figure 3:
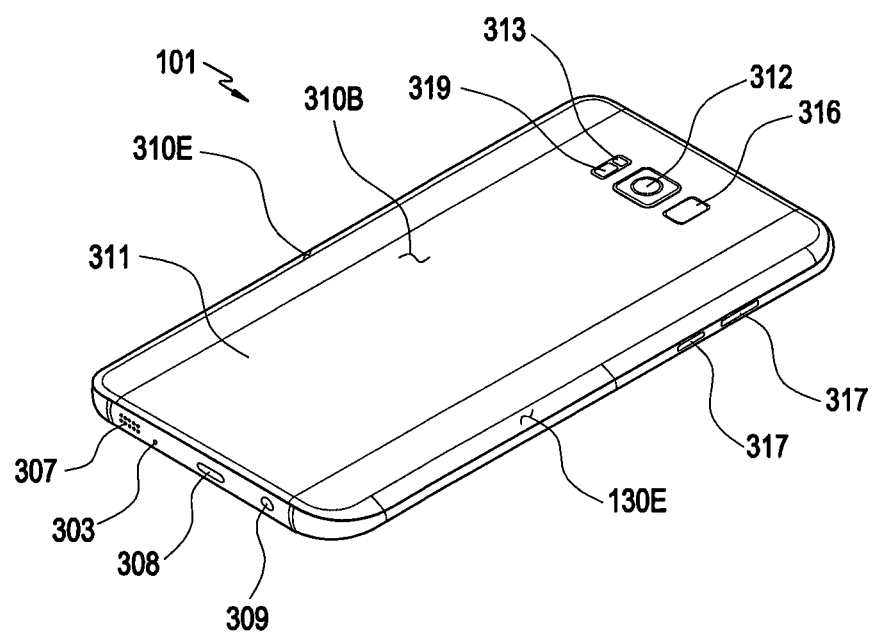
FIG. 3 is a rear side perspective view illustrating the electronic device according to various embodiments of the disclosure.

FIG. 2 is a front side perspective view illustrating an electronic device 101 according to various embodiments of the disclosure. FIG. 3 is a rear side perspective view illustrating the electronic device 101 according to various embodiments of the disclosure.

Referring to FIGS. 2 and 3, the electronic device 101 according to an embodiment may include a housing 310 including a first surface (or a front surface) 310A, a second surface (or a rear surface) 310B, and a side surface 310C surrounding the space between the first surface 310A and the second surface 310B. In another embodiment (not illustrated), the term "housing" may refer to a structure forming some of the first surface 310A, the second surface 310B, and the side surface 310C of FIG. 2. According to an embodiment, at least a portion of the first surface 310A may be formed of a substantially transparent front plate 302 (e.g., a glass plate or a polymer plate including various coating layers). The second surface 310B may be defined by a substantially opaque rear plate 311. The rear plate 311 may be made of, for example, coated or colored glass, ceramic, a polymer, a metal (e.g., aluminum, stainless steel (STS), or magnesium), or a combination of two or more of these materials. The side surface 310C may be defined by a side bezel structure 318 (or a "side member") coupled to the front plate 302 and the rear plate 311 and including a metal and/or a polymer. In some embodiments, the rear plate 311 and the side bezel structure 318 may be integrally formed, and may include the same material (e.g., a metal material such as aluminum).

In the illustrated embodiment, the front plate 302 may include, at the long opposite side edges thereof, two first areas 310D, which are bent from the first surface 310A towards the rear plate 311 and extend seamlessly. In the illustrated embodiment (see FIG. 3), the rear plate 311 may include, at the long opposite side edges thereof, two second areas 310E, which are bent from the second surface 310B towards the front plate 302 and extend seamlessly. In some embodiments, the front plate 302 (or the rear plate 311) may include only one of the first areas 310D (or the second areas 310E). In another embodiment, some of the first areas 310D and the second areas 310E may not be included. In the embodiments described above, when viewed from the side of the electronic device 101, the side bezel structure 318 may have a first thickness (or width) on the side surface portions that do not include the first areas 310D or the second areas 310E, and may have a second thickness, which is smaller than the first thickness, on the side surface portions that include the first areas 310D or the second areas 310E.

According to an embodiment, the electronic device 101 may include at least one of a display 301, audio modules 303, 307, and 314, sensor modules 304, 316, and 319, camera modules 305, 312, and 313, key input devices 317, light-emitting elements 306, and connector holes 308 and 309. In some embodiments, at least one of the components (e.g., the key input devices 317 or the light-emitting elements 306) may be omitted from the electronic device 101, or other components may be additionally included in the electronic device 101.

The display 301 may be exposed through a substantial portion of, for example, the front plate 302. In some embodiments, at least a portion of the display 301 may be exposed through the front plate 302 defining the first surface 310A and the first areas 310D of the side surface 310C. In some embodiments, the edges of the display 301 may be formed to be substantially the same as the shape of the periphery of the front plate 302 adjacent thereto. In another embodiment (not illustrated), the distance between the periphery of the display 301 and the periphery of the front plate 302 may be substantially constant in order to enlarge the exposed area of the display 301.

In another embodiment (not illustrated), recesses or openings may be formed in some portions of the screen display area of the display 301, and one or more of the audio module 314, the sensor module 304, the camera module 305, and the light-emitting elements 306, which are aligned with the recesses or the openings, may be included. In another embodiment (not illustrated), the rear surface of the screen display area of the display 301 may include at least one of the audio modules 314, the sensor modules 304, the camera modules 305, the fingerprint sensor 316, and the light-emitting elements 306. In another embodiment (not illustrated), the display 301 may be coupled to or disposed adjacent to a touch-sensitive circuit, a pressure sensor capable of measuring a touch intensity (pressure), and/or a digitizer configured to detect a magnetic-field-type stylus pen. In some embodiments, at least some of the sensor modules 304 and 319 and/or at least some of the key input devices 317 may be disposed in the first areas 310D and/or the second areas 310E.

The audio modules 303, 307, and 314 may include a microphone hole 303 and speaker holes 307 and 314. The microphone hole 303 may include a microphone disposed therein so as to acquire external sound, and in some embodiments, multiple microphones may be disposed therein so as to enable detection of the direction of sound. The speaker holes 307 and 314 may include an external speaker hole 307 and a phone call receiver hole 314. In some embodiments, the speaker holes 307 and 314 and the microphone hole 303 may be implemented as a single hole, or a speaker may be included therein without the speaker holes 307 and 314 (e.g., a piezo speaker).

The sensor modules 304, 316, and 319 may generate electrical signals or data values corresponding to the internal operating state or the external environmental state of the electronic device 101. The sensor modules 304, 316, and 319 may include, for example, a first sensor module 304 (e.g., a proximity sensor) and/or a second sensor module (not illustrated) (e.g., a fingerprint sensor) disposed on the first surface 310A of the housing 310, and/or a third sensor module 319 (e.g., an HRM sensor), and/or a fourth sensor module 316 (e.g., a fingerprint sensor) disposed on the second surface 310B of the housing 310. The fingerprint sensor may be disposed not only on the first surface 310A of the housing 310 (e.g., the display 301), but also on the second surface 310B. The electronic device 101 may further include at least one of sensor modules (not illustrated) such as a gesture sensor, a gyro sensor, an atmospheric pressure sensor, a magnetic sensor, an acceleration sensor, a grip sensor, a color sensor, an infrared (IR) sensor, a biometric sensor, a temperature sensor, a humidity sensor, or an illuminance sensor.

The camera modules 305, 312, and 313 may include a first camera device 305 disposed on the first surface 310A of the electronic device 101 and a second camera device 312 disposed on the second surface 310B thereof, and/or a flash 313. The camera modules 305 and 312 may include one or more lenses, an image sensor, and/or an image signal processor. The flash 313 may include, for example, a light-emitting diode or a xenon lamp. In some embodiments, two or more lenses (e.g., an infrared camera lens, a wide-angle lens, and a telephoto lens) and image sensors may be disposed on one surface of the electronic device 101.

The key input devices 317 may be disposed on the side surface 310C of the housing 310. In another embodiment, the electronic device 101 may not include some or all of the above-mentioned key input devices 317, and a key input device 317, which is not included in the electronic device 101, may be implemented in another form, such as a soft key, on the display 301. In some embodiments, the key input devices may include a sensor module 316 disposed on the second surface 310B of the housing 310.

The light-emitting element 306 may be disposed, for example, on the first surface 310A of the housing 310. The light-emitting elements 306 may provide, for example, information about the state of the electronic device 101 in an optical form. In another embodiment, the light-emitting element 306 may provide a light source that is interlocked with, for example, the operation of the camera module 305. The light-emitting elements 306 may include, for example, an LED, an IR LED, and a xenon lamp.

The connector holes 308 and 309 may include a first connector hole 308, which is capable of accommodating a connector (e.g., a USB connector) for transmitting and receiving power and/or data to and from an external electronic device, and/or a second connector hole 309, which is capable of receiving a connector (e.g., an earphone jack) for transmitting and receiving an audio signal to and from an external electronic device.

Figure 4:
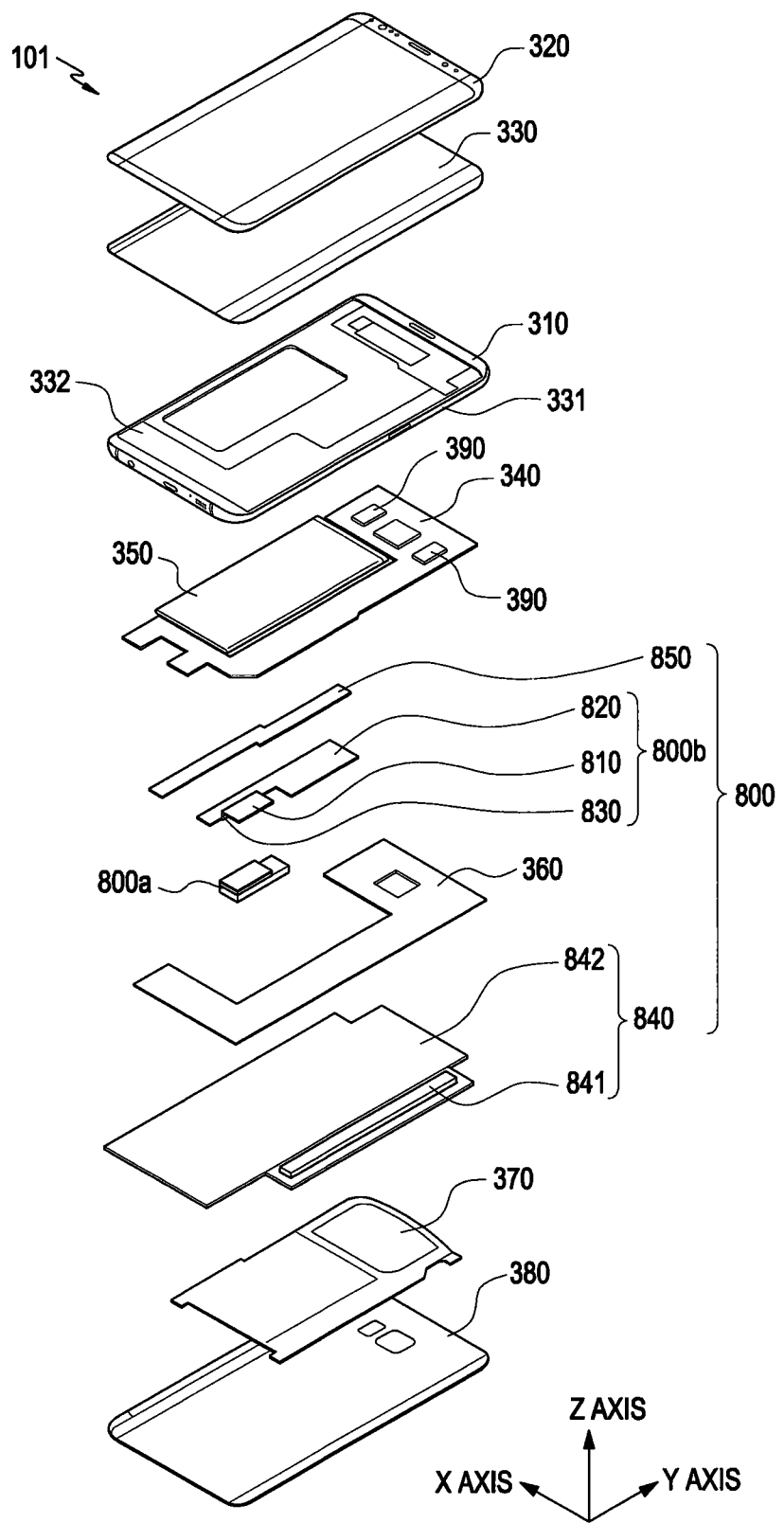
FIG. 4 is an exploded perspective view illustrating an electronic device including a heat dissipation structure according to various embodiments of the disclosure.

FIG. 4 is an exploded perspective view illustrating an electronic device 101 according to various embodiments.

Referring to FIG. 4, an electronic device 101 (e.g., the electronic device 101 in FIGS. 1 to 3) may include a side bezel structure 331, a first support member 332 (e.g., a bracket), a front plate 320 (e.g., a cover glass), a display 330, a printed circuit board 340, a battery 350, a second support member 360 (e.g., a rear case or a bracket), an antenna 370, and a rear plate 380. In some embodiments, at least one of the components (e.g., the first support member 332 or the second support member 360) may be omitted from the electronic device 101, or other components may be additionally included in the electronic device 101. At least one of the components of the electronic device 101 may be the same as or similar to at least one of the components of the electronic device 101 of FIG. 2 or 3, and a redundant description thereof is omitted below.

The first support member 332 may be disposed inside the electronic device 101 so as to be connected to the side bezel structure 331, or may be formed integrally with the side bezel structure 331. The first support member 332 may be formed of, for example, a metal material and/or a non-metal material (e.g., a polymer). The display 330 may be coupled to one surface of the first support member 332, and the printed circuit board 340 may be coupled to the other surface of the first support member 311. On the printed circuit board 340, a processor, a memory, and/or an interface may be mounted. The processor may include at least one of, for example, a central processing unit, an application processor, a graphics processor, an image signal processor, a sensor hub processor, or a communication processor.

The memory may include, for example, a volatile memory or a nonvolatile memory.

The interface may include, for example, a high-definition multimedia interface (HDMI), a universal serial bus (USB) interface, an SD card interface, and/or an audio interface. The interface may electrically or physically connect, for example, the electronic device 101 to an external electronic device, and may include a USB connector, an SD card/MMC connector, or an audio connector.

The battery 350 is a device for supplying power to at least one component of the electronic device 101, and may include, for example, a non-rechargeable primary battery, a rechargeable secondary battery, or a fuel cell. At least a portion of the battery 350 may be disposed on substantially the same plane as, for example, the printed circuit board 340. The battery 350 may be integrally disposed inside the electronic device 101, or may be detachably disposed on the electronic device 101.

The antenna 370 may be disposed between the rear plate 380 and the battery 350. The antenna 370 may include, for example, a nearfield communication (NFC) antenna, a wireless charging antenna, and/or a magnetic secure transmission (MST) antenna. The antenna 370 may perform short-range communication with, for example, an external electronic device, or may transmit/receive power required for charging to/from the external device in a wireless manner. In another embodiment, an antenna structure may be formed by a portion of the side bezel structure 331, a portion of the first support member 332, or a combination thereof.

According to various embodiments, an electronic device may include multiple communication devices 390. For example, some of the multiple communication devices 390 may be implemented in order to transmit and receive radio waves having different characteristics (provisionally referred to as radio waves of A and B frequency bands) for MIMO implementation. As another example, some of the multiple communication devices 390 may be configured, for example, to simultaneously transmit and receive radio waves having the same characteristics (provisionally referred to as radio waves having A1 and A2 frequencies in the A frequency band) for diversity implementation. As another example, the remaining ones of the multiple communication devices 390 may be configured, for example, to simultaneously transmit and receive radio waves having the same characteristics (provisionally referred to as radio waves having B1 and B2 frequencies in the B frequency band) for diversity implementation. In an embodiment of the disclosure, the electronic device 101 may include two communication devices, but, in another embodiment of the disclosure, the electronic device 101 may include four communication devices so as to simultaneously implement MIMO and diversity. In another embodiment, the electronic device 101 may include only one communication device 390.

According to an embodiment, in consideration of the transmission/reception characteristics of radio waves, when one communication device is disposed at a first position on the printed circuit board 340, another communication device may be disposed at a second position, which is separated from the first position on the printed circuit board 340. As another example, one communication device and another communication device may be arranged in consideration of the mutual separation distance between the one communication device and the other communication device according to a diversity characteristic.

According to an embodiment, at least one communication device 390 may include a wireless communication circuit that processes radio waves transmitted/received in a ultra-high-frequency band (e.g., 6 GHz or higher and 300 GHz or lower). The radiation conductor (s) (e.g., the radiation conductors 690 in FIG. 7A) of the at least one communication device 390 may include, for example, a patch-type radiation conductor or a radiation conductor having a dipole structure extending in one direction, and the multiple radiation conductors may be arrayed to form an antenna array. For example, a chip in which some of the wireless communication circuits are implemented (e.g., an integrated circuit chip) may be disposed on one side of the area in which the radiation conductor is disposed or on the surface that faces away from the surface on which the radiation conductor is disposed, and may be electrically connected to the radiation conductor (s) through wiring made of a printed circuit pattern. The at least one communication device 390 may include a first communication module (e.g., an antenna modem) and a second communication module (e.g., an antenna module).

Figure 5:
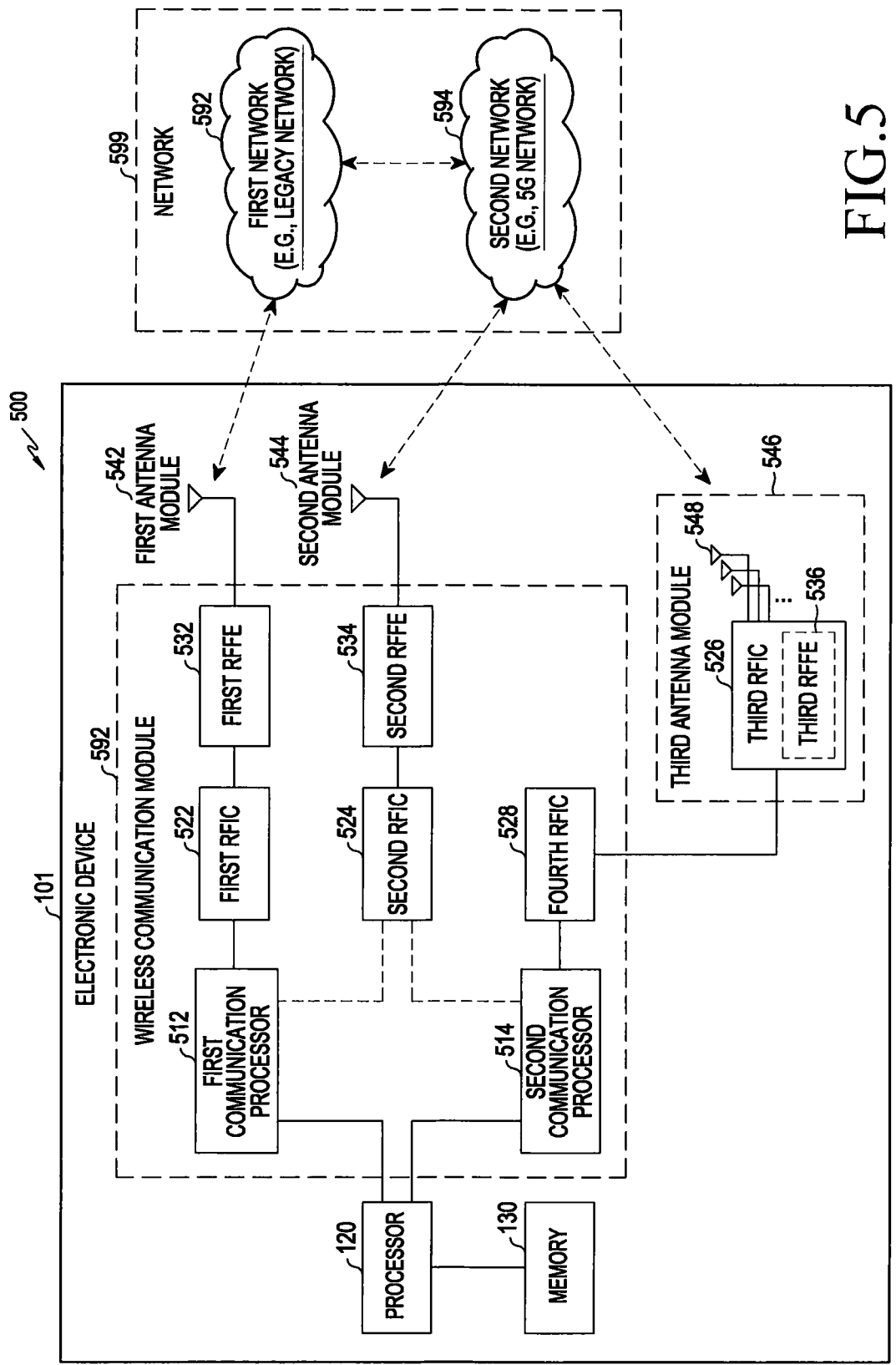
FIG. 5 is a block diagram of an electronic device configured to support a legacy network communication and a 5G network communication, according to various embodiments of the disclosure.

FIG. 5 is a block diagram 500 of an electronic device 101 configured to support a legacy network communication and a 5G network communication, according to various embodiments of the disclosure. Referring to FIG. 5, the electronic device 101 may include a first communication processor 512, a second communication processor 514, a first radio-frequency integrated circuit (RFIC) 522, a second RFIC 524, a third RFIC 526, a fourth RFIC 528, a first radio-frequency front end (RFFE) 532, a second RFFE 534, a first antenna module 542, a second antenna module 544, and an antenna 548. The electronic device 501 may further include a processor 520 and a memory 530. The network 599 may include a first network 592 and a second network 594. According to another embodiment, the electronic device 501 may further include at least one of the components illustrated in FIG. 5, and the network 599 may further include one or more other networks. According to an embodiment, the first communication processor 512, the second communication processor 514, the first RFIC 522, the second RFIC 524, the fourth RFIC 528, the first RFFE 532, and the second RFFE 534 may form at least a portion of a wireless communication module 592. According to another embodiment, the fourth RFIC 528 may be omitted, or may be included as a part of the third RFIC 526.

The first communication processor 512 may establish a communication channel in a band to be used for wireless communication with the first network 592, and may support legacy network communication via the established communication channel. According to various embodiments, the first network may be a legacy network including a second-generation (2G), 3G, 4G, or long-term evolution (LTE) network. The second communication processor 514 may establish a communication channel corresponding to a designated band (e.g., about 6 GHz to about 60 GHz) in a band to be used for wireless communication with the second network 594, and may support 5G network communication via the established communication channel. According to various embodiments, the second network 594 may be a 5G network defined in the 3GPP. In addition, according to an embodiment, the first communication processor 512 or the second communication processor 514 may establish a communication channel corresponding to another designated band (e.g., about 6 GHz or lower) in the band to be used for wireless communication with the second network 594, and may support 5G network communication through the established communication channel. According to an embodiment, the first communication processor 512 and the second communication processor 514 may be implemented in a single chip or in a single package. According to various embodiments, the first communication processor 512 or the second communication processor 514 may be formed in a single chip or a single package with the processor 520, an auxiliary processor 523, or a communication module 590.

During transmission, the first RFIC 522 may convert a baseband signal generated by the first communication processor 512 into an RF signal of about 700 MHz to about 3 GHz to be used in the first network 592 (e.g., a legacy network). During reception, an RF signal may be acquired from the first network 592 (e.g., the legacy network) through an antenna (e.g., the first antenna module 542), and may be pre-processed through an RFFE (e.g., the first RFFE 532). The first RFIC 522 may convert the pre-processed RF signal into a baseband signal to be processed by the first communication processor 512.

During transmission, the second RFIC 524 may convert the baseband signal generated by the first communication processor 512 or the second communication processor 514 into an RF signal in a Sub6 band (e.g., about 6 GHz or lower) (hereinafter, referred to as "5G sub6 RF signal") to be used in the second network 594 (e.g., a 5G network). During reception, the 5G Sub6 RF signal may be acquired from the second network 594 (e.g., a 5G network) through an antenna (e.g., the second antenna module 544), and may be pre-processed through an RFFE (e.g., the second RFFE 534). The second RFIC 524 may convert the pre-processed 5G Sub6 RF signal into a baseband signal so as to be processed by a corresponding one of the first communication processor 512 and the second communication processor 514.

The third RFIC 526 may convert the baseband signal generated by the second communication processor 514 into an RF signal in a 5G Above6 band (e.g., about 6 GHz to about 60 GHz) (hereinafter, referred to as a "5G Above6 RF signal") to be used in the second network 594 (e.g., a 5G network). During reception, the 5G Above6 RF signal may be acquired from the second network 594 (e.g., a 5G network) through an antenna (e.g., the antenna 548), and may be pre-processed through the third RFFE 536. The third RFIC 526 may convert the pre-processed 5G Above6 RF signal into a baseband signal to be processed by the second communication processor 514. According to an embodiment, the third RFFE 536 may be formed as a part of the third RFIC 526.

According to an embodiment, the electronic device 101 may include a fourth RFIC 528 separately from or as at least a portion of the third RFIC 526. In this case, the fourth RFIC 528 may convert the baseband signal generated by the second communication processor 514 into an RF signal (hereinafter, referred to as an "IF signal") in an intermediate-frequency band (e.g., about 9 GHz to about 11 GHz), and may then deliver the IF signal to the third RFIC 526. The third RFIC 526 may convert the IF signal into a 5G Above6 RF signal. During reception, the 5G Above6 RF signal may be received from the second network 594 (e.g., a 5G network) through an antenna (e.g., the antenna 548), and may be converted into an IF signal through the third RFIC 526. The fourth RFIC 528 may convert the IF signal into a baseband signal to be capable of being processed by the second communication processor 514.

According to an embodiment, the first RFIC 522 and the second RFIC 524 may be implemented as at least a portion of a single chip or a single package. According to an embodiment, the first RFFE 532 and the second RFFE 534 may be implemented as at least a portion of a single chip or a single package. According to an embodiment, at least one of the first antenna module 542 and the second antenna module 544 may be omitted, or may be combined with another antenna module so as to process RF signals of multiple corresponding bands.

According to an embodiment, the third RFIC 526 and the antenna 548 may be disposed on the same substrate so as to form a third antenna module 546. For example, the wireless communication module 592 or the processor 120 (e.g., the processor 120 in FIG. 1) may be placed on a first substrate (e.g., a main PCB). In such a case, the third RFIC 526 may be disposed on a partial area (e.g., the bottom surface) of a second substrate (e.g., a sub-PCB) separate from the first substrate, and the antenna 548 may be disposed on another partial area (e.g., the top surface), thereby forming the third antenna module 546. According to an example, the antenna 548 may include, for example, an antenna array that can be used for beamforming. By arranging the third RFIC 526 and the antenna 548 on the same substrate, it is possible to reduce the length of the transmission line therebetween. This makes it possible to reduce the loss (e.g., attenuation) of a signal in a high=frequency band (e.g., about 6 GHz to about 60 GHz) to be used for, for example, 5G network communication by the transmission line. As a result, the electronic device 501 is able to improve the quality or speed of communication with the second network 594 (e.g., a 5G network).

The second network 594 (e.g., a 5G network) may be operated independently from the first network 592 (e.g., a legacy network) (e.g., Stand-Alone (SA)), or may be operated in the state of being connected to the first network 592 (e.g., Non-Stand-Alone (NSA)). For example, in a 5G network, only an access network (e.g., a 5G radio access network (RAN) or a next-generation RAN (NG RAN)) may exist but a core network (e.g., a next-generation core (NGC)) may not exist. In this case, after accessing the access network of the 5G network, the electronic device 101 may access an external network (e.g., the Internet) under the control of the core network (e.g., an evolved packed core (EPC)) of a legacy network. Protocol information for communication with a legacy network (e.g., LTE protocol information) or protocol information for communication with a 5G network (e.g., new radio (NR) protocol information) may be stored in the memory 130 (e.g., the memory 130 in FIG. 1), and may be accessed by another component (e.g., the processor 120 (e.g., the processor 120 in FIG. 1), the first communication processor 512, or the second communication processor 514).

FIGS. 6A to 6C illustrate an embodiment of the structure of, for example, the third antenna module 546 described with reference to FIG. 5. FIG. 6A is a perspective view of the third antenna module (e.g., 546 in FIG. 5) viewed from one side, and FIG. 6B is a perspective view of the third antenna module (e.g., 546 in FIG. 5) viewed from the other side. FIG. 6C is a cross-sectional view of the third antenna module (e.g., 546 in FIG. 5) taken along line A-A'.

Referring to FIGS. 6A to 6C, in an embodiment, the third antenna module (e.g., 546 in FIG. 5) may include a printed circuit board 610, an antenna array 630, a radio-frequency integrated circuit (RFIC) 652, a power management integrated circuit (PMIC) 654, and a module interface. Alternatively, the third antenna module (e.g., 546 in FIG. 5) may further include a shield member 690. In other embodiments, at least one of the above-mentioned components may be omitted, or at least two of the components may be integrally formed.

The printed circuit board 610 may include multiple conductive layers and multiple non-conductive layers stacked alternately with the conductive layers. The printed circuit board 610 may provide an electrical connection between various electronic components mounted on the printed circuit board 610 and/or various electronic components disposed outside the printed circuit board 610 using wiring lines and conductive vias formed in the conductive layers.

The antenna array 630 (e.g., 548 in FIG. 5) may include multiple antenna elements 632, 634, 636, and 638 arranged to form directional beams. As illustrated, the antenna elements may be disposed on the first surface of the printed circuit board 610. According to another embodiment, the antenna array 630 may be formed inside the printed circuit board 610. According to embodiments, the antenna array 630 may include multiple antenna arrays, which are different or the same in shape or type (e.g., dipole antenna arrays and/or patch antenna arrays).

The RFIC 652 (e.g., 526 in FIG. 5) may be disposed in another area of the printed circuit board 610 spaced apart from the antenna array (e.g., the second surface opposite to the first surface). The RFIC is configured to be capable of processing signals in a selected frequency band transmitted/received through the antenna array 630. According to an embodiment, during transmission, the RFIC 652 may convert a baseband signal acquired from a communication processor (not illustrated) into an RF signal in a designated band. During reception, the RFIC 652 may convert an RF signal received through the antenna array 630 into a baseband signal and transmit the baseband signal to a communication processor.

According to another embodiment, during transmission, the RFIC 652 may up-convert an IF signal (of, e.g., about 9 GHz to about 11 GHz) acquired from an intermediate frequency integrated circuit (IFIC) (e.g., 528 in FIG. 5) into an RF signal of a selected band. During reception, the RFIC 652 may down-convert an RF signal acquired through the antenna array 630 into an IF signal and transmit the IF signal to the IFIC.

The PMIC 654 may be arranged in another area (e.g., the second surface) of the printed circuit board 610 spaced apart from the antenna array. The PMIC may receive a voltage from a main PCB (not illustrated) and may provide required power for various components (e.g., the RFIC 652) on the antenna module.

The shield member 690 may be arranged on a portion (e.g., the second surface) of the printed circuit board 610 so as to electromagnetically shield at least one of the RFIC 652 or the PMIC 654. According to an embodiment, the shield member 690 may include a shield can.

Although not illustrated, in various embodiments, the third antenna module 546 may be electrically connected to another printed circuit board (e.g., a main circuit board) via a module interface. The module interface may include a connecting member, such as a coaxial cable connector, a board-to-board connector, an interposer, or a flexible printed circuit board (FPCB). Through the connection member, the RFIC 652 and/or the PMIC 654 of the antenna module may be electrically connected to the printed circuit board.

FIGS. 7A to 7D illustrate an embodiment of the structure of the electronic device 101 illustrated in FIG. 5. In the illustrated embodiment, the electronic device (e.g., 101 in FIG. 5) may include a housing 710 including a first plate 720 (e.g., a front plate), a second plate 730 (e.g., a rear plate or a rear glass) spaced apart from the first plate 720 and facing away from the first plate 720, and a side member 740 surrounding the space between the first plate 720 and the second plate 730.

The first plate 720 may include a transparent material including glass plate. The second plate 730 may include a non-conductive material and/or a conductive material. In addition, the side member 740 may include a conductive material and/or a non-conductive material. In some embodiments, at least a portion of the side member 740 may be formed integrally with the second plate 730. In the illustrated embodiment, the side member 740 may include first to third insulating portions 741, 743, and 745 and first to third conductive portions 751, 753, and 755.

Within the space, the electronic device (e.g., 101 in FIG. 5) may include a display disposed to be visible through the first plate 720, a main printed circuit board (PCB) 771, and/or a mid-plate (not illustrated), and may optionally further include various other components.

According to an embodiment, the electronic device (e.g., 101 in FIG. 5) may include first and second antenna modules (e.g., 542 and 544 in FIG. 5) including a first legacy antenna 751, a second legacy antenna 753, and a third legacy antenna 755, and the first to third legacy antennas (751, 753, and 755) may be included in the space and/or in a portion of the housing 710 (e.g., the side member 740). The first to third legacy antennas 751, 753, and 755 may be used for, for example, cellular communication (e.g., $2^{nd}$-generation (2G), 3G, 4G, or LTE), nearfield communication (e.g., Wi-Fi, Bluetooth, or NFC), and/or a global navigation satellite system (GNSS).

The electronic device (e.g., 101 in FIG. 5) may include a third antenna module (e.g., 546 in FIG. 5) including a (3-1)th antenna module 761, a (3-2)th antenna module 763, and a (3-3)th antenna module 765 for forming directional beams. The (3-1)th, (3-2)th, and (3-3)th antenna modules 761, 763, and 765 may be used for 5G network (e.g., the second cellular network 594 in FIG. 5) communication, mmWave communication, 60 GHz communication, or WiGig communication. The (3-1)th, (3-2)th, and (3-3)th antenna modules 761, 763, and 765 may be arranged in the space so as to be spaced apart from metal members of the electronic device (e.g., 101 in FIG. 5 101) (e.g., the housing 710, an internal component 773, and/or the first to third legacy antennas 751, 753, and 755) by a predetermined interval or more.

In the illustrated embodiment, the (3-1)th antenna module 761 may be located at the upper end of the left side (−Y axis), the (3-2)th antenna module 763 may be located at the middle of the upper end (X axis), and the (3-3)th antenna module 765 may be located at the middle of the right side (Y axis). In another embodiment, the electronic device (e.g., 101 in FIG. 5) may include additional antenna modules at additional positions (e.g., at the middle of the lower end (−X axis)), or some of the (3-1)th to (3-3)th antenna modules 761, 763, and 765 may be omitted. According to an embodiment, the (3-1)th to (3-3)th antenna modules 761, 763, and 765 may be electrically connected to at least one communication processor 510 on a main PCB 771 using a conductive line 781 (e.g., a coaxial cable or an FPCB).

Figure 6:
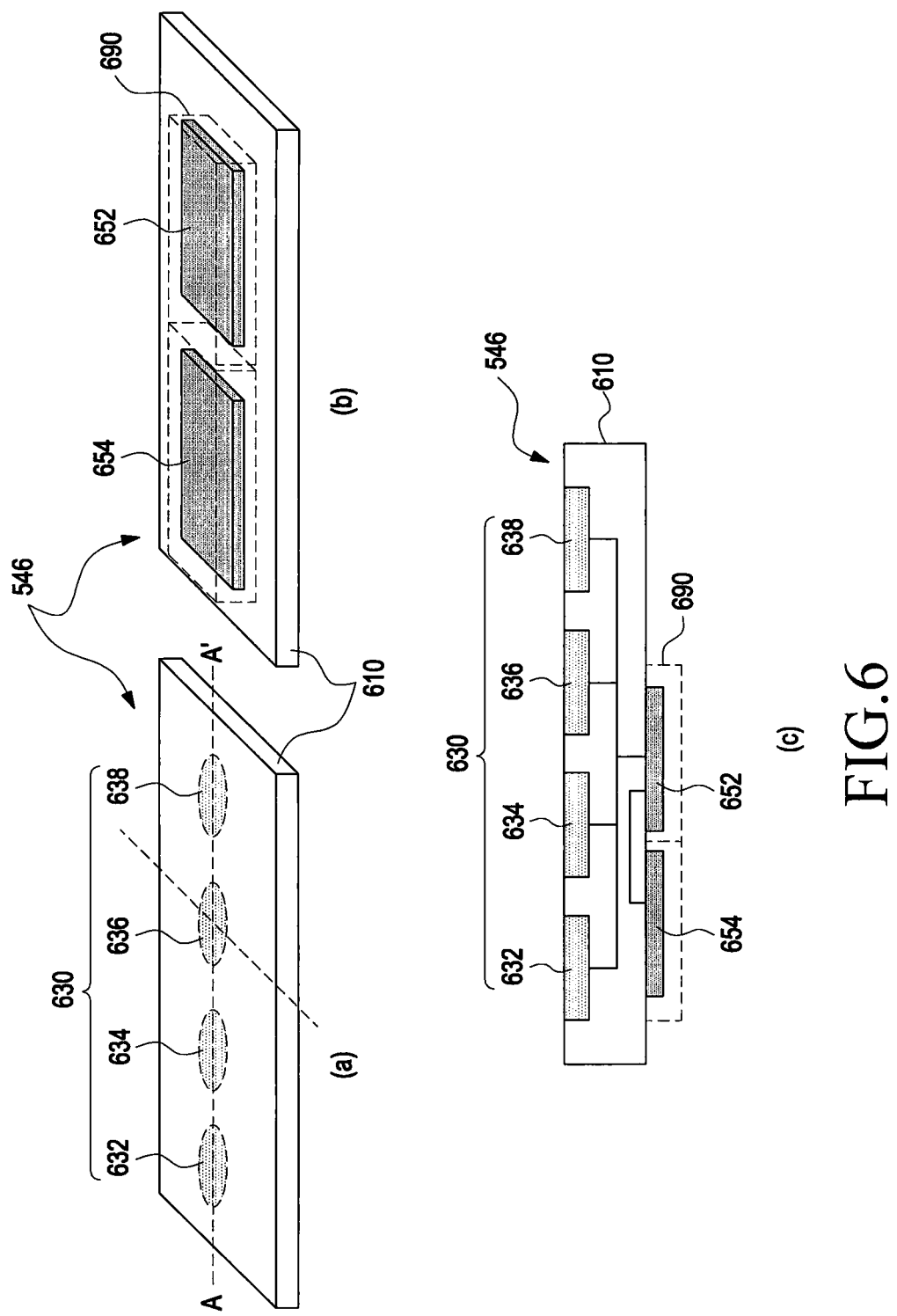
FIGS. 6A to 6C illustrate an embodiment of a structure of a third antenna module according to various embodiments of the disclosure.
Figure 7:
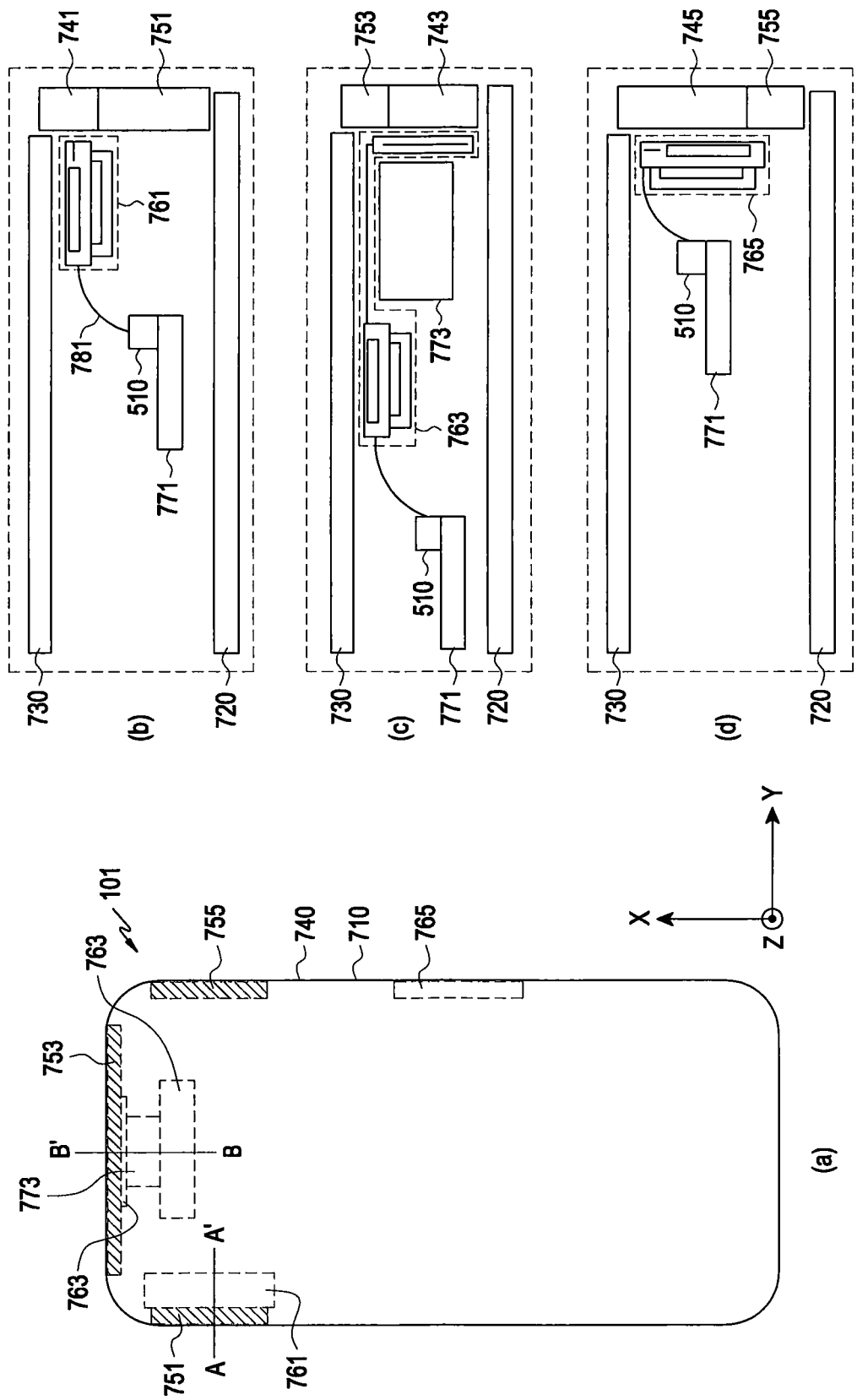
FIGS. 7A to 7D illustrate an embodiment of the structure of the electronic device illustrated in FIGS. 6A to 6C, according to various embodiments of the disclosure.

Referring to FIG. 7B, which illustrates a cross section taken along axis A-A' in FIG. 7A, some (e.g., a patch antenna array) of the antenna arrays of the (3-1)th antenna module 761 (e.g., the antenna array 630 in FIG. 6) may be disposed to emit radiation toward the second plate 730, and remaining ones (e.g., a dipole antenna array) of the antenna arrays of the (3-1)th antenna module 761 may be disposed to emit radiation through the first insulating portion 741. Referring to FIG. 7C, which illustrates a cross section taken along axis B-B' in FIG. 7A, some (e.g., a patch antenna array) of the radiators of the (3-2)th antenna module 763 may be disposed to emit radiation toward the second plate 730, and remaining ones (e.g., a dipole antenna array) of the radiators may be disposed to emit radiation through the second insulating portion 743.

In the illustrated embodiment, the (3-2) antenna module 763 may include a plurality of printed circuit boards (e.g., the printed circuit board 610 in FIG. 6). For example, some (e.g., a patch antenna array) of the antenna array (630 in FIG. 6) and remaining ones (e.g., a dipole antenna array) of the antenna array (630 in FIG. 6) may be located on different printed circuit boards (e.g., 610 in FIG. 6). According to an embodiment, the printed circuit boards (610 in FIG. 6) may be connected via a flexible printed circuit board. The flexible printed circuit board may be arranged around electrical components 773 (e.g., a receiver, a speaker, sensors, a camera, an earphone jack, or a button).

Referring to FIG. 7D, which illustrates a cross section taken along axis C-C' in FIG. 7A, the (3-3)th antenna module 765 may be arranged to face the side member 740 of the housing 710. Some (e.g., a dipole antenna array) of the antenna arrays (630 in FIG. 6a) of the (3-3)th antenna module 765 may be arranged to emit radiation toward the second plate 730, and remaining ones (e.g., a patch antenna array) may be disposed to emit radiation through the third insulating portion 745.

Figure 8:
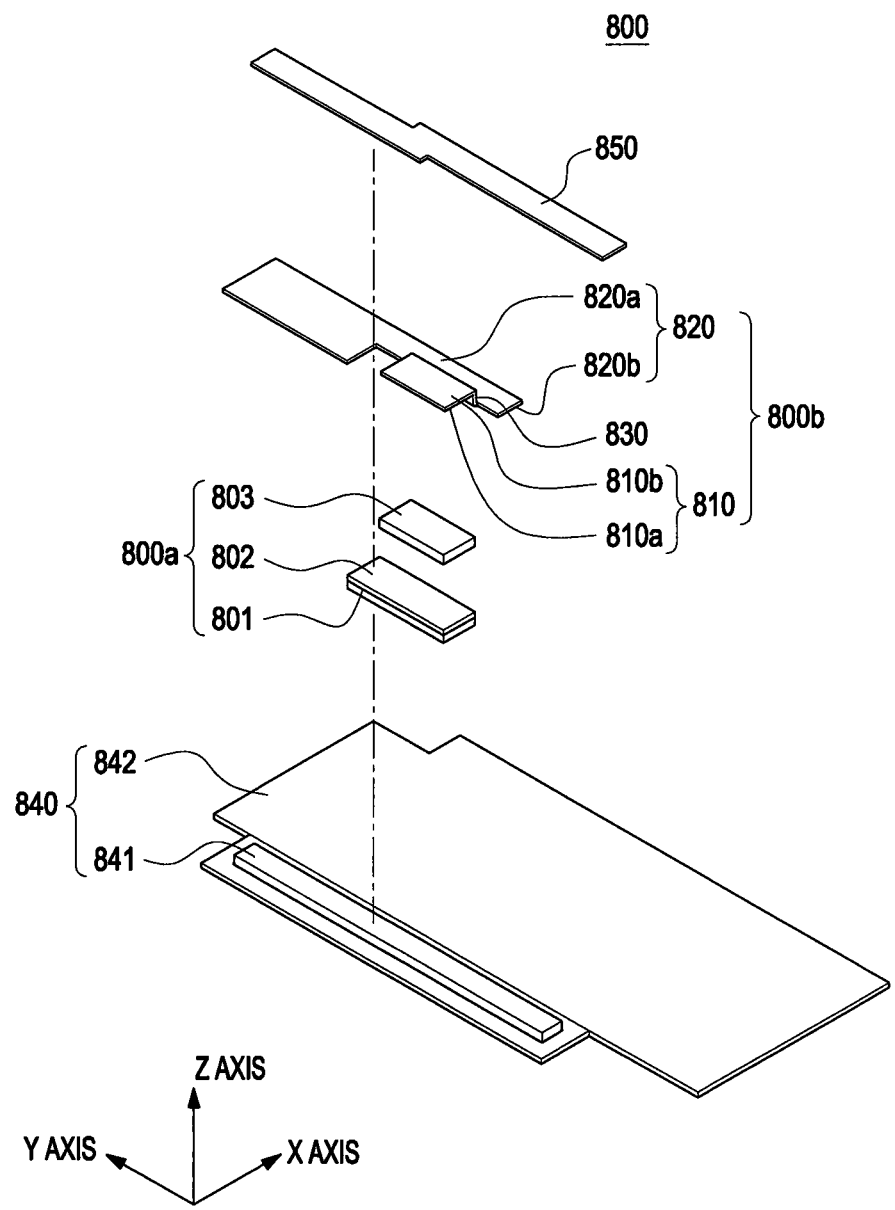
FIG. 8 is an enlarged perspective view illustrating the configuration of a heat dissipation member included in an electronic device according to various embodiments of the disclosure.

FIG. 8 is a perspective view illustrating the configuration of a heat dissipation structure included in an electronic device (e.g., 101 in FIG. 4) according to various embodiments of the disclosure.

Referring to FIGS. 4 and 8 described above, an electronic device 101 including a heat dissipation structure 800 according to various embodiments may include a side bezel structure 331, a first support member 332 (e.g., a bracket), a front plate 320, a second support member 360 (e.g., a rear case or a bracket), a rear plate 380, first and second printed circuit boards 340 and 801 arranged in a first direction (e.g., X axis or Y axis) in the electronic device; and at least one electric element 900a and a heat dissipation structure 800 arranged in the first direction (e.g., X-axis or Y-axis) at a position adjacent to the first printed circuit board 340. For example, the at least one electric element 800a may include a modular antenna modem (not illustrated). In this embodiment, the at least one electric element 800a is described with reference to an antenna modem (not illustrated) by way of an example, but is not limited thereto. For example, the at least one electric element 800a may be variously applied as long as it is a modular electric element 800a. For example, the at least one electric element 800a may include at least one of a power management module, an audio module, a haptic module, a camera module, a sensor module, a communication module, a subscriber identification module, and an antenna module. The electric element 800a in this embodiment will be described with reference to an antenna module.

A first communication circuit (not shown) may be arranged on the first printed circuit board 340. The second printed circuit board 801 may include a first surface and a second surface. The second printed circuit board 801 may include a second communication circuit (not illustrated) arranged on the first surface and at least one antenna module 800a arranged on the second surface. The at least one antenna module 800a may be electrically connected to the first printed circuit board 340. For example, the antenna module 800a may include at least one antenna (the antenna elements 632, 634, 636, or 638 in FIG. 6) or an antenna pattern.

According to an embodiment, the first and second printed circuit boards 340 and 801 are arranged to be separated from each other, and the first printed circuit board 340 may be arranged in parallel with a first thermal diffusion member 840 to be described later.

The antenna module 800a may include a second printed circuit board 801 including an antenna array (e.g., 630 in FIG. 6), and may include a shield member 802 surrounding the second printed circuit board 801, and an antenna heat transfer member 803 arranged so as to face the first heat transfer area 810 of the heat transfer member 800b to be described later on the top surface of the shield member 802. According to an embodiment, the shield member may include at least one of conformal shielding (e.g., molding) or a shield can.

The heat dissipation structure 800 may include a heat transfer member 800b including first, second, and third heat transfer areas 810, 820, and 830 and first and second thermal diffusion members 840 and 850. For example, in the heat transfer member 800b, the first, second, and third heat transfer areas 810, 820, and 830 may be integrally connected to each other. In addition, one surface of the at least one partial area of the heat transfer member 800b and one surface of the at least one other surface may be arranged so as not to be parallel to each other. For example, the first heat transfer area 810 and the second heat transfer area 820 may be arranged so as not to be parallel to each other.

The first surface 810*a* of the first heat transfer area 810 may face the antenna heat transfer member 803 of the antenna module 800*a* arranged on one surface of the second printed circuit board 801, and the second surface 810*b* of the first heat transfer area 810 opposite to the first surface 810*a* may face one surface of the first printed circuit board 340.

In this state, heat A1 generated from the antenna module 800*a* may be transferred to the first heat transfer area 810, the first heat transfer area 810 may transfer at least part of the transferred heat A1 to the first printed circuit board 340 so as to dissipate the heat, and may transfer some of the remaining heat A1 to the second heat transfer area 820.

The second heat transfer area 820 may be arranged in the first direction (e.g., X axis or Y axis) so as to be stepped from the first heat transfer area 810. For example, the first surface 820*a* of the second heat transfer area 820 may be arranged to correspond to one surface of the first thermal diffusion member 840 embedded in the electronic device (e.g., 101 in FIG. 4), and the second surface 820*b* of the second heat transfer area 820 opposite to the first surface 820*a* may be arranged to correspond to one surface of the second thermal diffusion member 850 embedded in the electronic device (e.g., 101 in FIG. 4). For example, the second heat transfer area 820 may transfer the heat A1 received from the first heat transfer area 810 to the first and second thermal diffusion members 840 and 850, and the first and second thermal diffusion members 840 and 850 may diffuse or disperse the received heat A1 so as to dissipate the heat.

The third heat transfer area 830 may be bent and arranged in a second direction (e.g., Z axis) perpendicular to the first direction (e.g., X axis or Y axis) between the first and second heat transfer areas 810 and 820 so as to interconnect the stepped first and second heat transfer areas 810 and 820. For example, the first and second heat transfer areas 810 and 820 may be arranged so as to be stepped from each other, and the third heat transfer area 830 may interconnect the stepped first and second heat transfer areas 810 and 820. Accordingly, the third heat transfer area 830 may transfer the heat A1 of the first heat transfer area 810 to the second heat transfer area 820.

The third heat transfer area 830 may include a bending member, and the shape of the bending member may include at least one of an "L" shape, a "Z" shape, or a thunderbolt shape. The third heat transfer area 830 may be variously applied as long as it is a shape that is bent in addition to the above-described shape.

According to an embodiment, the size and thickness of the electric element 800*a* provided in the electronic device (e.g., 101 in FIG. 4) and the sizes and thicknesses of the first and second thermal diffusion members 840 and 850 are different from each other, the position of the electric element 800*a* and the positions of the first and second thermal diffusion members 840 and 850 may be differently arranged. For example, the electric element 800*a* and the first and second thermal diffusion members 840 and 850 may be arranged to be stepped from each other. Accordingly, the first heat transfer area 810 arranged to correspond to the electric element 800*a* and the second heat transfer area 820 arranged to correspond to the first and second thermal diffusion members 840 and 850 may also be arranged so as to be stepped from each other. In this way, the third heat transfer area 830 may be arranged between the first and second heat transfer areas 810 and 820 in order to interconnect the first and second heat transfer areas 810 and 820 arranged so as to be stepped from each other. Accordingly, the first and second heat transfer areas 810 and 820 may smoothly receive heat A1 generated by the electric element 800*a* through the third heat transfer area 830.

According to an embodiment, the first, second, and third heat transfer areas 810, 820, and 830 may form a heat transfer path that transfers the heat A1 to the first and second thermal diffusion members 840 and 850.

Figure 9:
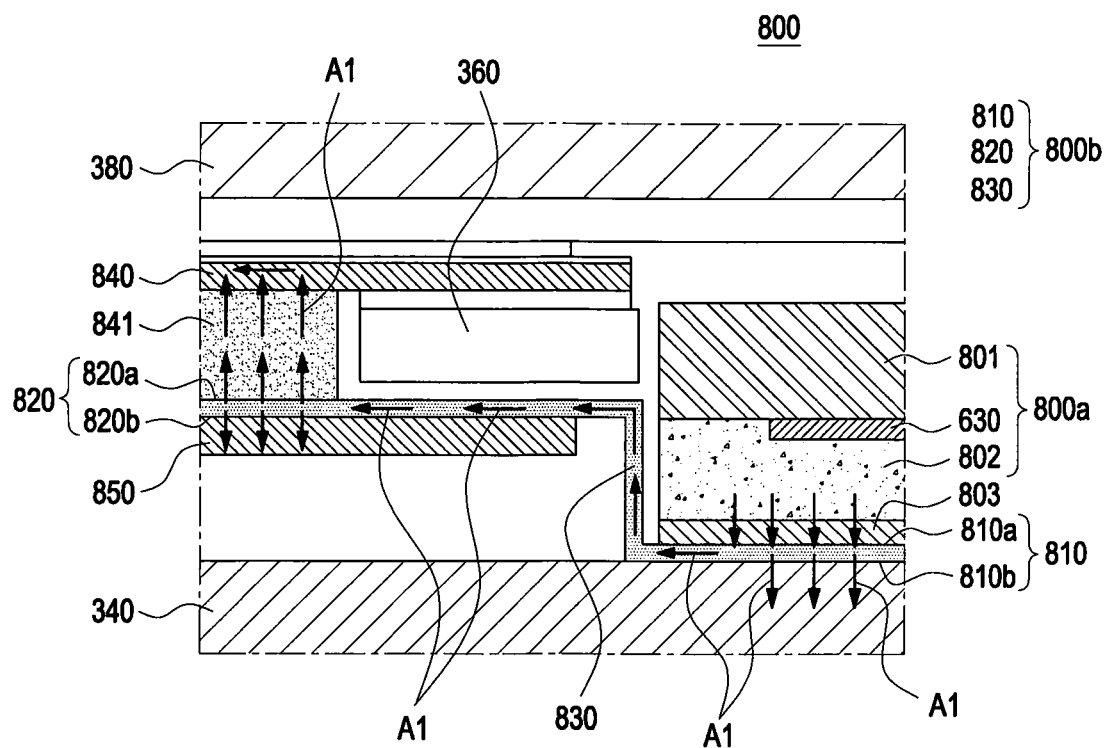
FIG. 9 is a cross-sectional side view illustrating an operating state of a heat dissipation structure included in an electronic device according to various embodiments of the disclosure.

FIG. 9 is a cross-sectional side view illustrating an operating state of a heat dissipation structure 800 included in an electronic device according to various embodiments of the disclosure.

Referring to FIG. 9, the heat dissipation structure 800 may include a heat transfer member 800*b* including first, second, and third heat transfer areas 810, 820, and 830 and first and second thermal diffusion members 840 and 850. For example, the first surface 810*a* of the first heat transfer area 810 may face the antenna heat transfer member 803 of the antenna module 800*a*, and the second surface 810*b* of the first heat transfer area 810 opposite to the first surface 810*a* may face one surface of the first printed circuit board 340. The second heat transfer area 820 may be disposed below the first heat transfer area 810 to be stepped from each other. In this state, one end of the third heat transfer area 830 may be connected to the first heat transfer area 810 and may be bent from the first heat transfer area 810 so as to be arranged in a vertical second direction (e.g., Z axis), and the other end of the third heat transfer area 830 may be connected to the second heat transfer area 820. The first surface 820*a* of the second heat transfer area 820 may be arranged to correspond to one surface of the first thermal diffusion member 840, and the second surface 820*b* of the second heat transfer area 820 opposite to the first surface may be arranged to correspond to one surface of the second thermal diffusion member 850.

In this state, the antenna module 800*a* may generate heat A1 during operation of signal processing or the like, and the heat A1 generated from the antenna module 800*a* may be transferred to the first heat transfer area 810. The first heat transfer area 810 may transfer a part of the transferred heat A1 to the first printed circuit board 340 so as to dissipate the heat, and the remaining heat A1 may be transferred to the third heat transfer area 830. The third heat transfer area 830 may change the transfer direction of the transferred heat from a first direction (e.g., X axis or Y axis) to a second direction (e.g., Z-axis) perpendicular to the first direction (e.g., X-axis or Y-axis). The third heat transfer area 830 may transfer the heat A1, the direction of which is changed, to the second heat transfer area 820. At least some of heat A1 transferred to the second heat transfer area 820 may be transferred to the first thermal diffusion member 840 facing the first surface 820*a* of the second heat transfer area 820 so as to dissipate the heat. At least some of the remaining heat A1 may be transferred to the second thermal diffusion member 850 facing the second surface 820*b* of the second heat transfer area 820 opposite to the first surface so as to dissipate the heat.

According to an embodiment, the first thermal diffusion member 840 may include at least one of a heat pipe or a vapor chamber. In this embodiment, the second thermal diffusion member 840 will be described with reference to a vapor chamber. The vapor chamber may include a chamber heat transfer member 841 and a chamber body 842. For example, the chamber heat transfer member 841 may be arranged to correspond to the first surface 820*a* of the second heat transfer area 820, and may receive the heat A1 transferred through the first surface of the second heat transfer area 820. The chamber body 842 may diffuse or disperse the heat A1 transferred to the chamber heat transfer member 851 so as to dissipate the heat.

According to an embodiment, the chamber heat transfer member 841 may include a heat transfer material in order to rapidly diffuse the transferred heat in the chamber heat transfer member 841 and/or the chamber body 842 by a vapor chamber. The heat transfer material of the chamber heat transfer member 841 is in a liquid or solid state, and may include carbon fiber particles.

According to an embodiment, the second thermal diffusion member 850 may include a heat pipe or a vapor chamber. In this embodiment, the second thermal diffusion member 850 will be described with reference to a heat pipe. Accordingly, the heat A1 transferred through the second surface 820b of the second heat transfer area 820 may be dissipated through the second thermal diffusion member 850, which is a heat pipe, or discharged to the outside.

According to an embodiment, a part of the first and second thermal diffusion members 840 and 850 may be omitted or may be modified as a heat dissipation sheet, a metal plate, or the like.

According to an embodiment, the first and second thermal diffusion members 840 and 850 may include at least one of a thermal diffusion member (a thermal spreader), a heat pipe, a vapor chamber, or a thermal plate.

Figure 10:
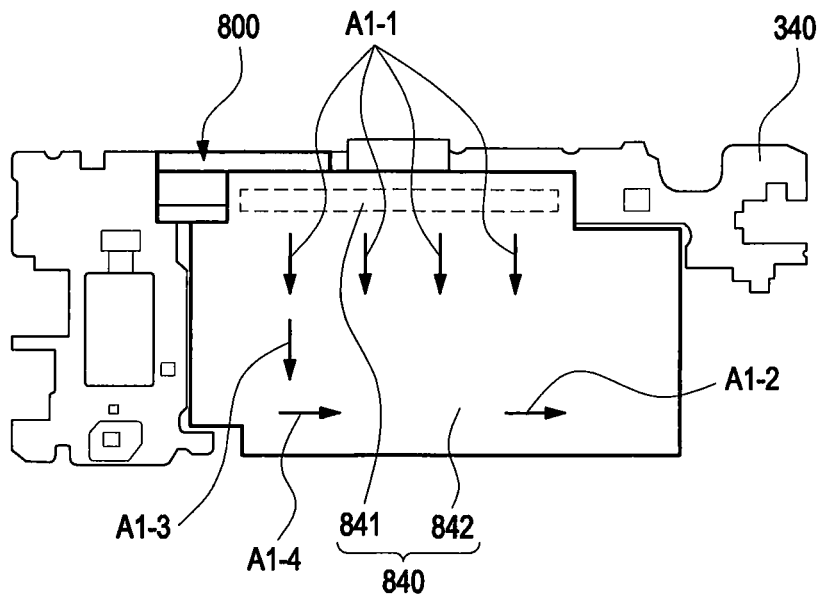
FIG. 10 is a plan view illustrating an operating state of a thermal diffusion structure of a heat dissipation structure included in an electronic device according to various embodiments of the disclosure.

As illustrated in FIG. 10, the heat A1 transferred to the first surface 820a of the second heat transfer area 820 may be transferred to the chamber heat transfer member 841 of the first thermal diffusion member 840, and the heat A1 transferred to the chamber heat transfer member 841 may be diffused into the entire chamber body 842 so as to be dissipated. For example, high-temperature heat A1-1 transferred to the chamber heat transfer member 841 may be vertically diffused to at least one partial area, and the vertically diffused heat A1-1 may be horizontally diffused so as to be diffused from a high-temperature area to a low-temperature area of the first thermal diffusion member 840. The horizontally diffused heat A1-2 may be horizontally diffused and simultaneously diffused into the low-temperature area. In addition, the horizontally diffused heat A1-2 may be vertically diffused to at least one other area of the first thermal diffusion member 840. Heat A1-3 vertically diffused to the at least one other area may be horizontally diffused again through the first thermal diffusion member 840. Horizontally diffused heat A1-4 may be diffused to the low-temperature area of the first thermal diffusion member of 840.

In this way, the high-temperature heat A1 of the chamber heat transfer area 841 may be transferred to the first thermal diffusion member 840 and may rapidly diffuse to the entire first thermal diffusion member 840 through vertical or horizontal diffusion so as to be diffused or dispersed in a wider area of the electronic device. For example, it is possible to prevent heat A1 from being concentrated in the area where the electric element 800a is arranged.

The first and second thermal diffusion members 840 and 850 may include at least one of copper (Cu) or a ceramic material (e.g., boron nitride or aluminum nitride). In this embodiment, at least one of the first and second thermal diffusion members 840 and 850 is described with reference to copper (Cu) or a ceramic material as an example, but is not limited thereto. For example, the first and second thermal diffusion members 840 and 850 may be variously applied as long as they are made of a material for diffusing or dispersing heat A1 transferred from the second heat transfer area 820.

According to various embodiments, the first and second thermal diffusion members 840 and 850 include at least one of, for example, copper (Cu) or a ceramic material (e.g., boron nitride or aluminum nitride), thereby facilitating the diffusion of the heat A1 transferred from the second heat transfer area 820. In addition, the copper (Cu) or the ceramic material may be easily processed to perform thermal diffusion in a direction required in the heat dissipation structure or conforming to the design of the heat dissipation structure.

In this way, by arranging the third heat transfer area 830 bent from the first heat transfer area 810 in a second direction (e.g., Z axis) perpendicular to the first direction (e.g., X axis or Y axis) between the first and second heat transfer areas 810 and 820, it is possible for the third heat transfer area 830 to interconnect the first and second heat transfer areas 810 and 820, which are arranged to be stepped from each other. As a result, it is possible to transfer heat A1 of the first heat transfer area 810 to the second heat transfer area 820 through the third heat transfer area 830, and to transfer the heat A1 transferred to the second heat transfer area 820 to the first and second thermal diffusion members 840 and 850 arranged to correspond to the first surface 820a or the second surface 820b of the second heat transfer area 820 so as to be dissipated by being diffused and dispersed. Accordingly, it is possible not only to dissipate the heat A1 of the modular electric element 800a, but also to create a stable operating environment for the electric element 800a. For example, the heat transfer member 800b including the first, second, and third heat transfer areas 810, 820, and 830 and the first and second thermal diffusion members 840 and 850 are capable of transferring, diffusing, or dispersing the heat generated from the electric element 800a. Thus, it is possible to lower the temperature of the electric element 800a or the temperature of the space in which the electric element 800a is disposed in the electronic device.

According to an embodiment, the electric elements 800a having various sizes and thicknesses provided in the electronic device (e.g., 101 in FIG. 4) may be connected to the first and second thermal diffusion members 840 and 850 by the heat transfer member 800b including the first, second, and third heat transfer areas 810, 820, and 830. For example, the first heat transfer area 810 facing the electric elements are arranged in parallel in the first direction (e.g., X-axis or Y-axis), the first heat transfer area 810 may be connected to the third heat transfer area 830 arranged in the vertical second direction (e.g., Z-axis), and the third heat transfer area 830 may be connected to the stepped second heat transfer area 820. The second heat transfer area 820 may be connected to the first and second thermal diffusion members 840 and 850.

As described above, even when the positions of the electric elements 800a and the positions of the first and second thermal diffusion members 840 and 850 are disposed to be different from each other, the electric elements 800a and the first and second thermal diffusion members 840 and 850 may be connected to each other via the first, second, and third heat transfer areas 810, 820, and 830. Accordingly, it is easy to arrange the electric elements 800a and the first and second thermal diffusion members 840 and 850 in the electronic device (e.g., 101 in FIG. 4) using the first, second, and third heat transfer areas 810, 820, and 830, and it is also possible to improve the efficiency of mounting the electric elements and the first and second thermal diffusion members.

Figure 11:
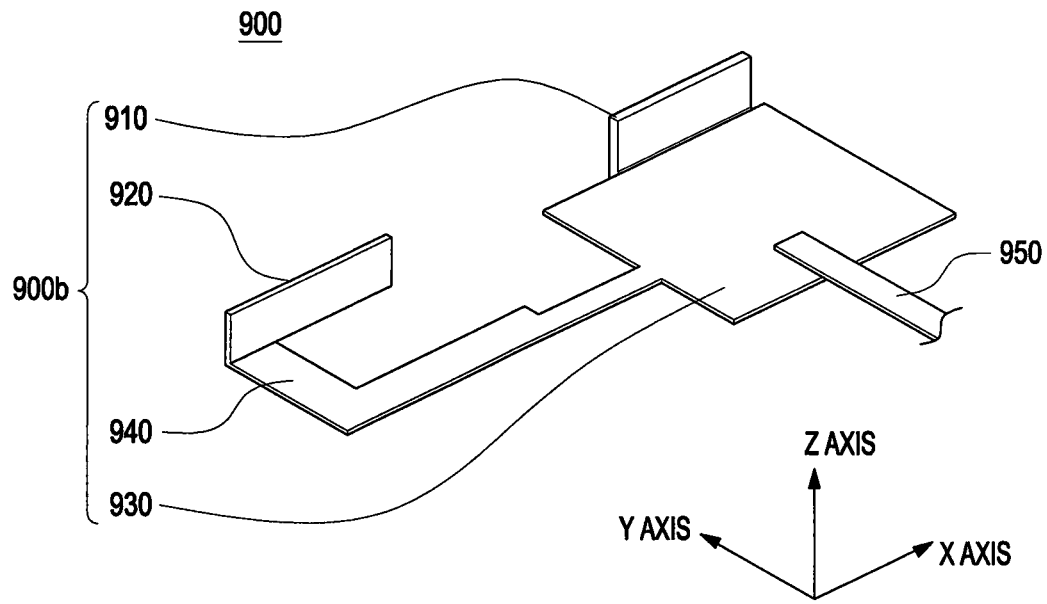
FIG. 11 is a perspective view illustrating a heat dissipation structure included in an electronic device according to other various embodiments of the disclosure.

FIG. 11 is a perspective view illustrating the configuration of a heat dissipation structure 900 included in an electronic device (e.g., 101 in FIG. 4) according to various other embodiments of the disclosure.

Referring to FIGS. 4 and 11 described above, an electronic device 101 including a heat dissipation structure 900 according to various embodiments may include a side bezel structure 331, a first support member 332 (e.g., a bracket), a front plate 320, a second support member 360 (e.g., a rear case), a rear plate 380, a first printed circuit board 340 arranged in a first direction (e.g., X axis or Y axis) in the electronic device 101, a second printed circuit board (e.g., 901 in FIG. 12) including a plurality of electric elements 900a arranged at a position adjacent to the first printed circuit board 340 in a second direction (e.g., Z axis) perpendicular to the first direction (e.g., X axis or Y axis), and a heat dissipation structure 900. For example, the plurality of electric elements 900a may include at least one of a modular antenna modem or an antenna module 900a. For example, the antenna module 900a may include the second printed circuit board (e.g., 901 in FIG. 12) including an antenna array (e.g., 630 in FIG. 6) and a communication module (not illustrated), the antenna module 900a may include a shield member (e.g., 902 in FIG. 12) surrounding the second printed circuit board (e.g., 901 in FIG. 12), and the antenna module 900a may include an antenna heat transfer member (e.g., 903 in FIG. 12) arranged on the top surface of the shield member (e.g., 902 in FIG. 12) and facing the first and second heat transfer areas 910 and 902.

At least one of the components of the electronic device 101 may be the same as or similar to at least one of the components of the electronic device 101 of FIG. 4, and a redundant description thereof will be omitted below.

The heat dissipation structure 900 may include a heat transfer member 900b including first, second, third, and fourth heat transfer areas 910, 920, 930, and 940 and a thermal diffusion member 950. For example, the first and second heat transfer areas 910 and 920 may be arranged in the second direction (e.g., Z-axis) so as to correspond to one surfaces of the plurality of electric elements 900a. For example, the plurality of electric elements 900a may include first and second antenna modules (e.g., 900a-1 and 900a-2 in FIG. 13), one surface of the first antenna module (e.g., 900a-1 in FIG. 13) may be arranged to correspond to one surface of the first heat transfer area 910, and one surface of the second antenna module (e.g., 900a-2 in FIG. 13) may be arranged to correspond to one surface of the second heat transfer area 920. For example, since the first and second antenna modules (e.g., 900a-1 and 900a-2 in FIG. 13) maybe arranged in the second direction (e.g., Z-axis), and the first and second heat transfer areas 910 and 920 corresponding to the first and second antenna modules (e.g., 900a-1 and 900a-2 in FIG. 13) may also be arranged in the second direction (e.g., Z-axis).

The third heat transfer area 930 may be connected to the first heat transfer area 910, and may be arranged in the first direction (e.g., X-axis or Y-axis), and the third heat transfer area 930 may connect the second heat transfer area 920 and the thermal diffusion member 950. According to various embodiments, the fourth heat transfer area 940 may include a bending member so as to interconnect the second heat transfer area 920 and the third heat transfer area 930, and the shape of the bending member may include at least one of an "L" shape, a "Z" shape, or a thunderbolt shape. The fourth heat transfer area 940 may be variously applied as long as it is a shape that is bent in addition to the above-described shape.

The first, second, third, and fourth heat transfer areas 910, 920, 930, and 940 may be integrally connected to each other.

Figure 12:
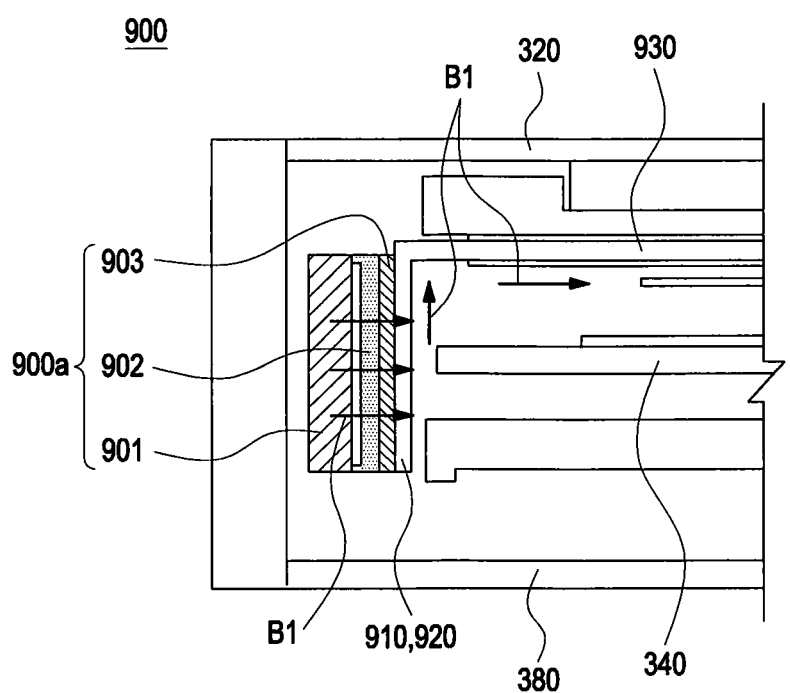
FIG. 12 is a cross-sectional side view illustrating an operating state of a heat dissipation structure included in an electronic device according to various other embodiments of the disclosure.
Figure 13:
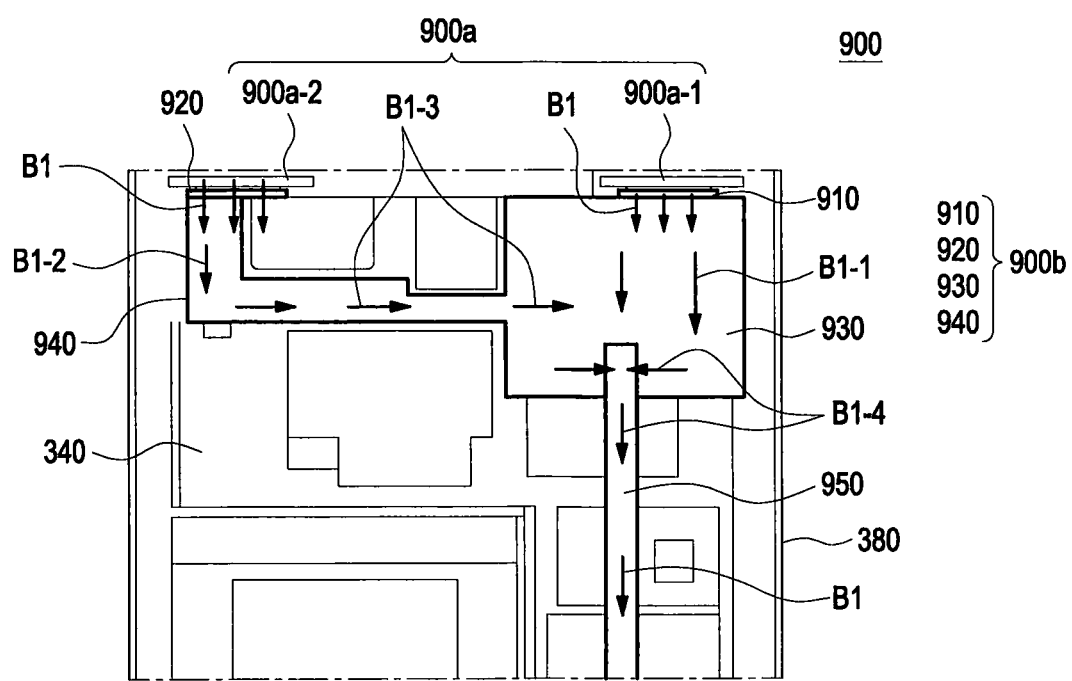
FIG. 13 is a plan view illustrating an operating state of a heat dissipation structure included in an electronic device according to various other embodiments of the disclosure.

FIG. 12 is a cross-sectional side view illustrating the operation state of a heat dissipation structure 900 included in an electronic device (e.g., 101 in FIG. 4) according to various other embodiments of the disclosure. FIG. 13 is a plan view illustrating the operation state of a heat dissipation structure 900 included in an electronic device (e.g., 101 in FIG. 4) according to various other embodiments of the disclosure.

Referring to FIGS. 12 and 13, the heat dissipation structure 900 may include a heat transfer member 900b including first, second, third, and fourth heat transfer areas 910, 920, 930, and 940 and a thermal diffusion member 950. For example, the front surface of the first heat transfer area 910 may be arranged to correspond to one surface of the first antenna module 900a-1 arranged in the second direction (e.g., Z axis), and the lower surface of the first heat transfer area 910 may be connected to at least some side surfaces of the third heat transfer area 930. The at least some side surfaces of the third heat transfer area 930 may be connected to one end of the fourth heat transfer area 940, and the other end of the fourth heat transfer area 940 may be connected to the lower surface of the second heat transfer area 920. The front surface of the second heat transfer area 920 may be arranged to correspond to one surface of the second antenna module 900a-2 arranged in the second direction (e.g., Z axis).

In this state, the first and second antenna modules 900a-1 and 900a-2 may generate heat B1 during operation of signal processing or the like, and the heat B1 generated from the first antenna module 900a-1 may be transferred to the first heat transfer area 910. The first heat transfer area 910 may transfer the heat B1 transferred thereto to the third heat transfer area 930, and the third heat transfer area 930 may primarily diffuse at least some of the transferred heat B1 so as to dissipate the heat. At least some of the less dissipated heat B1 may be transferred to the thermal diffusion member 950 connected to the third heat transfer area 930 and may be discharged to the outside.

The heat B1 generated from the second antenna module 900a-2 may be transferred to the second heat transfer area 920, and the heat B1 of the second heat transfer area 920 may be transferred to the fourth heat transfer area 940. The heat B1 transferred to the fourth heat transfer area 940 may be transferred to the third heat transfer area 930, and at the third heat transfer area 930 may primarily diffuse or discharge at least some of the transferred heat B1. At least some of the less dissipated heat B1 may be transferred to the thermal diffusion member 950 connected to the third heat transfer area member 930 and discharged to the outside.

According to an embodiment, the thermal diffusion member 950 may include a heat pipe or a vapor chamber. Therefore, the heat B1 transferred through the first, second, and fourth heat transfer areas 910, 920, and 940 may be primarily dissipated in the third heat transfer area 930, and secondarily dissipated or discharged to the outside through the thermal diffusion member 950, which is a heat pipe.

Figure 14:
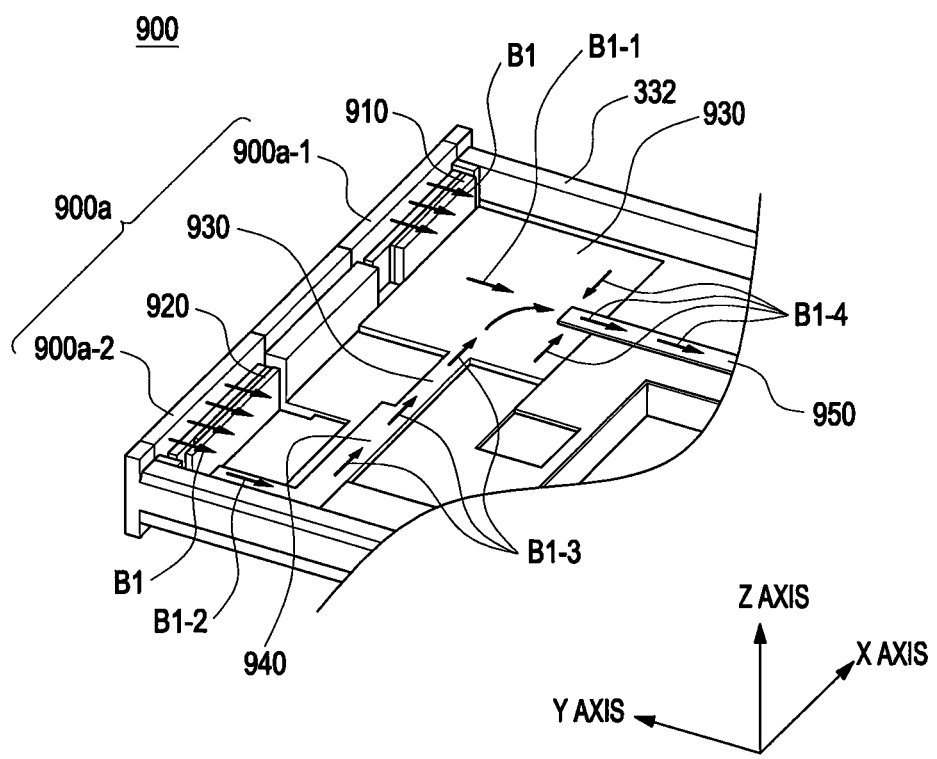
FIG. 14 is a perspective view illustrating an operating state of a heat dissipation structure included in an electronic device according to various other embodiments of the disclosure.

As illustrated in FIG. 14, the first and second antenna modules 900a-1 and 900a-2 may be disposed in the second direction (Z axis), and one surfaces of the first and second heat transfer areas 910 and 920 may be arranged to correspond to one surfaces of the first and second antenna modules 900a-1 and 900a-2, respectively. Heat B1 generated due to the operation of the first antenna module 900a-1 may be vertically diffused. The vertically diffused heat B1 may be transferred to the first heat transfer area 910, and vertically diffused heat B1-1 of the first heat transfer area 910 may be directly transferred to the third heat transfer area 930 and diffused and discharged at the same time. For example, it is possible to prevent heat from being concentrated in a certain area (e.g., the space in which the first antenna module 900a-1 is disposed). Heat B1 generated due to the operation of the second antenna module 900a-2 may flow vertically. The vertically flowing heat may be transferred to the second heat transfer area 920, and the heat B1-2 transferred to the second heat transfer area 920 flows from vertically to horizontally to be transferred to the fourth heat transfer area 940. The heat B1 transferred to the second heat transfer area 920 may flow horizontally via the fourth heat transfer area 940 to be transferred to the third heat transfer area 930 and diffused and dissipated at the same time. The horizontally flowing heat B1-2 may be horizontally diffused in the third heat transfer area 930. At this time, the heat B1-4, which is less dissipated in the third heat transfer area 930, may be diffused from horizontally to vertically in the third heat transfer area 930, and may be transferred to the thermal diffusion member 950 through the third heat transfer area 930 to be discharged to the outside.

According to an embodiment, the first, second, third, and fourth areas 910, 920, 930, and 940 may form a heat transfer path that transfers heat B1 generated from the first and second antenna modules 900a-1 and 900a-2 to the thermal diffusion member 950.

In this way, the heat B1 transferred from the first, second, and fourth heat transfer areas 910, 920, and 940 may be primarily dissipated by the third heat transfer area 930, and the remaining heat B1, which is less dissipated in the heat transfer area 930, may be transferred to the thermal diffusion member 950 connected to the third heat transfer area 930 so as to be dissipated. As a result, it is possible not only to dissipate heat generated from the modular electric element 900a, but also to create a stable operating environment for the electric element 900a.

According to an embodiment, since it is possible to arrange the heat transfer member 900b including the first, second, third, and fourth heat transfer areas 910, 920, 930, and 940 according to the arrangement of the electronic elements 900a provided in the electronic device (e.g., 101 in FIG. 4), it is possible not only facilitate the arrangement of the heat transfer member 900b including the first, second, third, and fourth heat transfer areas 910, 920, 930, and 940 in the electronic device (e.g., 410 in FIG. 4), but also to improve the mountability of the same.

According to various embodiments of the disclosure, an electronic device (101 in FIG. 4) may include: a first printed circuit board (340 in FIG. 4); a thermal diffusion member (thermal spreader) (840 or 850 in FIG. 8) arranged in parallel to the first printed circuit board; a second printed circuit board (801 in FIG. 8) arranged to be separated from the first printed circuit board and electrically connected to the first printed circuit board; and a heat transfer member (800b in FIG. 8) including at least one partial area arranged to face the thermal diffusion member and at least one other partial area bent and arranged to face one surface of the second printed circuit board.

According to various embodiments of the disclosure, the at least one partial area of the heat transfer member and the at least one other partial area may have a step therebetween.

According to various embodiments of the disclosure, one surface of the at least one partial area of the heat transfer member and one surface of the at least one other partial area may not be parallel to each other.

According to various embodiments of the disclosure, the first printed circuit board may include a first communication circuit arranged thereon, and the second printed circuit board may include a second communication circuit arranged thereon.

According to various embodiments of the disclosure, the second communication circuit may be arranged on one surface of the second printed circuit board, and the second printed circuit board may include at least one antenna arranged on another surface thereof.

According to various embodiments of the disclosure, an electronic device may include: a printed circuit board on which a communication circuit is arranged; a thermal diffusion member (thermal spreader) arranged in parallel to the printed circuit board; an antenna module arranged to be separated from the printed circuit board, and electrically connected to the printed circuit board so as to be functionally connected to the communication circuit; and a heat transfer member including at least one partial area arranged to face the thermal diffusion member and at least one other partial area formed through bending and arranged to face one surface of the antenna module.

According to various embodiments of the disclosure, an electronic device (101 in FIG. 4) may include: a first printed circuit board (340 in FIG. 9) on which a first communication circuit is arranged; a second printed circuit board (801 in FIG. 9) including a first surface, on which a second communication circuit is arranged, and a second surface; at least one antenna module arranged to face the second surface and electrically connected to the first printed circuit board; a thermal diffusion member (thermal spreader) (840 or 850 in FIG. 9) arranged in parallel to the first printed circuit board; and a heat transfer member (800b in FIG. 9) including an area, at least a portion of which is bent and which is arranged to face the first surface of the second printed circuit board, and another area, at least a portion of which is arranged to face the thermal diffusion member so as to form a heat transfer path that transfers heat generated from the first surface to the thermal diffusion member.

According to various embodiments of the disclosure, an electronic device (101 in FIG. 4) may include: first and second printed circuit boards (340 and 801 in FIG. 9) on each of which at least one electric element is mounted; first and second thermal diffusion members (840 and 850 in FIG. 10); and a heat transfer member, wherein the heat transfer member may include: a first heat transfer area (810 in FIG. 9) arranged in a first direction (X axis or Y axis) to correspond to one surface of the at least one electric element arranged on the second printed circuit board; a second heat transfer area (820 in FIG. 9) arranged in the first direction (X axis or Y axis) to be stepped from the first heat transfer member; and a third heat transfer area (e.g., 830 in FIG. 9) arranged between the first and second heat transfer areas and bent from the first heat transfer area to a second direction (Z axis) perpendicular to the first direction (X axis or Y axis), wherein a first surface of the first heat transfer area may be arranged to correspond to one surface of the first printed circuit board, and a second surface of the first heat transfer area opposite to the first surface of the first heat transfer area may be arranged to correspond to one surface of the second printed circuit board, wherein first surface of the second heat transfer area may be arranged to correspond to one surface of the first thermal diffusion member and a second surface of the second heat transfer area opposite to the first surface of the second heat transfer area may be arranged to correspond to one surface of the second thermal diffusion member, and wherein the third heat transfer area may interconnect the first and second heat transfer areas, which are arranged to be stepped.

According to various embodiments of the disclosure, the second printed circuit board may include at least one of an antenna modem or an antenna module.

According to various embodiments of the disclosure, the second printed circuit board (801 in FIG. 9) may include an antenna array and a communication module, the second printed circuit board (801 in FIG. 9) may include a shield member (802 in FIG. 9) that surrounds the communication module, and one surface of the shield member may include an antenna heat transfer member (803 in FIG. 9) facing the first surface of the first heat transfer area.

According to various embodiments, the third heat transfer area may include a bending member, and the bending member may include at least one of an "L" shape, a "Z" shape, or a thunderbolt shape.

According to various embodiments of the disclosure, the first thermal diffusion member may include at least one of a heat pipe or a vapor chamber.

According to various embodiments, the second thermal diffusion member may include at least one of a heat pipe or a vapor chamber.

According to various embodiments of the disclosure, the vapor chamber may include: a chamber heat transfer member arranged to correspond to the first surface of the second heat transfer area; and a chamber body configured to diffuse or disperse heat transferred to the chamber heat transfer member.

According to various embodiments of the disclosure, the first and second thermal diffusion members may include at least one of Cu or a ceramic material.

According to various embodiments, an electronic device (101 in FIG. 4) may include: a first printed circuit board (340 in FIG. 12) arranged in a first direction (X axis or Y axis) in the electronic device; a second printed circuit board (e.g., 901 in FIG. 12) including a plurality of electric elements arranged in a second direction (Z axis) perpendicular to the first direction (X axis or Y axis); a heat transfer member (900b in FIG. 13) including first and second heat transfer areas (e.g., 910 and 920 in FIG. 13) arranged in the second direction (Z axis) to correspond to one surfaces of the plurality of electric elements, a third heat transfer area (930 in FIG. 13) connected to the first heat transfer area and arranged in the first direction (X axis or Y axis), and a fourth heat transfer area (900b in FIG. 13) interconnecting the second heat transfer area and the third heat transfer area; and a thermal diffusion member (950 in FIG. 13) connected to the third heat transfer area.

According to various embodiments of the disclosure, the plurality of electric elements may include at least one of a modular antenna modem or an antenna module.

According to various embodiments of the disclosure, the second printed circuit board (901 in FIG. 12) may include an antenna array and a communication module and may include a shield member (902 in FIG. 12) that surrounds the communication module, and one surface of the shield member may include an antenna heat transfer member (903 in FIG. 12) facing the first surface of the first heat transfer area.

According to various embodiments of the disclosure, the thermal diffusion member may include at least one of a heat pipe or a vapor chamber.

According to various embodiments of the disclosure, the vapor chamber may diffuse or disperse heat transferred to the first, second, third, and fourth heat transfer areas.

As will be apparent to a person ordinarily skilled in the technical field to which the disclosure belongs, an electronic device including a heat dissipation structure according to various embodiments of the disclosure is not limited by the above-described embodiments and drawings, and may be variously substituted, modified, and changed within the technical scope of the disclosure.

The invention claimed is:

1. An electronic device comprising:
   a first printed circuit board arranged in a first direction;
   a first thermal diffusion member including at least one of a heat pipe or a vapor chamber and arranged in parallel to the first printed circuit board;
   a second printed circuit board arranged in a second direction substantially perpendicular to the first direction to be separated from the first printed circuit board and electrically connected to the first printed circuit board; and
   a heat transfer member including
   at least one partial area arranged to face the first thermal diffusion member and
   at least one other partial area arranged to face one surface of the second printed circuit board,
   wherein the at least one other partial area of the heat transfer member is bent from the at least one partial area of the heat transfer member.

2. The electronic device of claim 1, wherein the first printed circuit board includes a first communication circuit arranged thereon, and
   wherein the second printed circuit board includes a second communication circuit arranged thereon.

3. The electronic device of claim 2, wherein the second communication circuit is arranged on the one surface of the second printed circuit board, and
   wherein the second communication circuit includes at least one antenna arranged on another surface thereof.

4. The electronic device of claim 1, wherein an area provided by bending at least a portion of the heat transfer member is arranged to face the one surface of the second printed circuit board, and
   wherein at least a portion of another area of the heat transfer member is arranged to face the first thermal diffusion member so as to form a heat transfer path that transfers heat generated from the one surface of the second printed circuit board to the first thermal diffusion member.

5. The electronic device of claim 1, further comprising:
   at least one electronic element arranged on the first printed circuit board;
   at least one other electronic element arranged on the second printed circuit board; and
   a second thermal diffusion members,
   wherein the heat transfer member comprises:
   a first heat transfer area arranged in a first direction to correspond to one surface of the at least one other electric element;
   a second heat transfer area arranged in the first direction to be stepped from the first heat transfer area; and
   a third heat transfer area arranged between the first and second heat transfer areas and bent from the first heat transfer area to a second direction perpendicular to the first,
   wherein a first surface of the first heat transfer area is arranged to correspond to one surface of the first printed circuit board, a second surface of the first heat transfer area opposite to the first surface of the first heat transfer area is arranged to correspond to the one surface of the second printed circuit board,
   wherein a first surface of the second heat transfer area is arranged to correspond to one surface of the first thermal diffusion member and a second surface of the second heat transfer area opposite to the first surface of the second heat transfer area is arranged to correspond to one surface of the second thermal diffusion member, and wherein the third heat transfer area interconnects the first and second heat transfer areas, which are arranged to be stepped.

6. The electronic device of claim 5, wherein the second printed circuit board includes at least one of an antenna modem or an antenna module, wherein the second printed circuit board includes an antenna array and a communication module, wherein the second printed circuit board includes a shield member that surrounds the communication module, and wherein one surface of the shield member includes an antenna-side heat transfer member facing the first surface of the first heat transfer area.

7. The electronic device of claim 5, wherein the third heat transfer area includes a bending member, and wherein a shape of the bending member includes at least one of an "L" shape, a "Z" shape, or a thunderbolt shape.

8. The electronic device of claim 5, wherein
the second thermal diffusion member includes at least one of a heat pipe or a vapor chamber.

9. The electronic device of claim 8, wherein the vapor chamber includes a chamber heat transfer member arranged to correspond to the first surface of the second heat transfer area, and a chamber body configured to diffuse or disperse heat transferred to the chamber heat transfer member.

10. The electronic device of claim 5, wherein the first and second thermal diffusion members include at least one of copper or a ceramic material.

11. The electronic device of claim 1, wherein:

the second printed circuit board includes a plurality of electric elements arranged in the second direction perpendicular to the first direction, the heat transfer member includes first and second heat transfer areas arranged in the second direction to correspond to one surfaces of the plurality of electric elements, a third heat transfer area connected to the first heat transfer area and arranged in the first direction, and a fourth heat transfer area interconnecting the second heat transfer area and the third heat transfer area; and the first thermal diffusion member connected to the third heat transfer area.

12. The electronic device of claim 11, wherein the plurality of electric elements include at least one of a modular antenna modem or an antenna module.

13. The electronic device of claim 11, wherein
the first thermal diffusion member is configured to diffuse or disperse heat transferred from the plurality of electric elements to the first, second, third, and fourth heat transfer areas.

* * * * *